(12) United States Patent
Miyazaki et al.

(10) Patent No.: US 9,859,632 B2
(45) Date of Patent: Jan. 2, 2018

(54) COMPOSITE SUBSTRATE AND RIGID SUBSTRATE

(71) Applicant: TAIYO YUDEN CO., LTD., Tokyo (JP)

(72) Inventors: Masashi Miyazaki, Tokyo (JP); Yuichi Sugiyama, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 85 days.

(21) Appl. No.: 14/962,710

(22) Filed: Dec. 8, 2015

(65) Prior Publication Data

US 2016/0172774 A1 Jun. 16, 2016

Related U.S. Application Data

(60) Provisional application No. 62/091,397, filed on Dec. 12, 2014.

(51) Int. Cl.
| | |
|---|---|
| *H05K 1/00* | (2006.01) |
| *H01R 12/62* | (2011.01) |
| *H05K 1/18* | (2006.01) |
| *H05K 1/14* | (2006.01) |
| *H05K 1/11* | (2006.01) |

(Continued)

(52) U.S. Cl.
CPC ............ *H01R 12/62* (2013.01); *H05K 1/117* (2013.01); *H05K 3/4697* (2013.01); *H05K 1/028* (2013.01); *H05K 1/118* (2013.01); *H05K 1/147* (2013.01); *H05K 1/189* (2013.01); *H05K 3/361* (2013.01); *H05K 3/4691* (2013.01); *H05K 2201/042* (2013.01); *H05K 2201/056* (2013.01); *H05K 2201/09036* (2013.01); *H05K 2201/09127* (2013.01); *H05K 2201/09709* (2013.01)

(58) Field of Classification Search
CPC ........ H05K 1/028; H05K 1/147; H05K 1/189; H05K 2201/056; H05K 1/118; H05K 3/4691; H05K 2201/042
USPC ............... 361/749, 750, 761, 762, 789, 790; 174/254
See application file for complete search history.

(56) References Cited

U.S. PATENT DOCUMENTS

| | | | | |
|---|---|---|---|---|
| 2008/0283276 A1* | 11/2008 | Takahashi | ............ | H05K 3/4602 174/250 |
| 2012/0325524 A1* | 12/2012 | Naganuma | ........... | H05K 3/4691 174/254 |
| 2013/0153269 A1* | 6/2013 | Takahashi | .............. | H05K 3/368 174/254 |

FOREIGN PATENT DOCUMENTS

| | | |
|---|---|---|
| JP | 2005-011859 A | 1/2005 |
| JP | 2012-134490 A | 7/2012 |

* cited by examiner

*Primary Examiner* — Binh Tran
(74) *Attorney, Agent, or Firm* — Chen Yoshimura LLP

(57) ABSTRACT

A composite substrate has a rigid substrate that includes: a core layer, a first laminated layer on a first surface of the core layer, and a second laminated layer on a second surface of the core layer, the rigid substrate having a cutout in the core layer and the second laminated layer on one side face of the rigid substrate; and a flexible substrate inserted into the cutout in the rigid substrate on the one side face and laterally and externally protruding from the one side face of the rigid substrate, wherein the rigid substrate has opposing walls each constituted of the second laminated layer and the core layer erected on the first laminated layer to define inner side faces, respectively, of the cutout so as to accommodate the (Continued)

flexible substrate in a direction perpendicular to a direction in which the side face of the rigid substrate extends.

4 Claims, 31 Drawing Sheets

(51) Int. Cl.
*H05K 3/46* (2006.01)
*H05K 1/02* (2006.01)
*H05K 3/36* (2006.01)

COMPOSITE SUBSTRATE AND RIGID SUBSTRATE

BACKGROUND OF THE INVENTION

Technical Field

The present invention relates to a composite substrate, in which a rigid substrate and a flexible substrate are joined together.

Background Art

A composite substrate formed by joining a rigid substrate to a flexible substrate that is flexible is widely used in various electronic devices. Many ways of joining a rigid substrate to a flexible substrate have been developed.

Patent Document 1 discloses a rigid-flexible printed circuit in which a flexible substrate is laminated on a rigid substrate, for example. Forming a cutout in the base substrate removes part of the base substrate, which makes it possible to prevent contamination by the residues from the base substrate.

Also, Patent Document 2 discloses a composite wiring substrate in which a flexible substrate is sandwiched between rigid substrates. Forming dummy vias in the rigid substrates allows equal pressure to be applied to the flexible substrate, thereby making it possible to prevent warping of the flexible substrate.

RELATED ART DOCUMENTS

Patent Documents

Patent Document 1: Japanese Patent Application Laid-Open Publication No. 2012-134490
Patent Document 2: Japanese Patent Application Laid-Open Publication No. 2005-011859

SUMMARY OF THE INVENTION

However, in the composite substrate according to Patent Document 1 or 2, it is difficult to reduce the thickness of the composite substrate because the flexible substrate and the rigid substrate are stacked together. The recent miniaturization of electronic devices has increased the demand for reducing the thickness of composite substrates. A composite substrate is generally divided into individual pieces after the rigid substrate and the flexible substrate are joined together. Part of the rigid substrate is wasted in this process, and it has therefore been difficult to bring down the manufacturing cost.

In view of the circumstances described above, a purpose of the present invention is to provide a composite substrate and a rigid substrate that are suitable for reducing thickness and have structures that yield excellent productivity. Accordingly, the present invention is directed to a scheme that substantially obviates one or more of the above-discussed and other problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a composite substrate, including: a rigid substrate including a core layer, a first laminated layer on a first surface of the core layer, and a second laminated layer on a second surface of the core layer that is opposite to the first surface, the first laminated layer having at least one layer each of an insulating layer and a wiring layer laminated together on the first surface, the second laminated layer having at least one layer each of an insulating layer and a wiring layer laminated together on the second surface, the rigid substrate having a cutout in the core layer and the second laminated layer on one side face of the rigid substrate, exposing partially a surface of the first laminated layer as a bottom surface of the cutout, the partially exposed surface of the first laminated layer having connection terminals formed thereon; and a flexible substrate inserted into the cutout in the rigid substrate on the one side face and laterally and externally protruding from the one side face of the rigid substrate, the flexible substrate being electrically connected to the connection terminals, wherein the rigid substrate has opposing walls each constituted of the second laminated layer and the core layer erected on the first laminated layer to define inner side faces, respectively, of the cutout so as to accommodate the flexible substrate in a direction perpendicular to a direction in which the side face of the rigid substrate extends.

In another aspect, the present disclosure provides a composite substrate, including: a rigid substrate formed by laminating a core layer, an insulating layer, and a wiring layer together, the rigid substrate having a first thickness, a cutout in at least one of four sides thereof, and a first connection terminal exposed from the cutout; and a flexible substrate joined in the cutout, the flexible substrate having a second connection terminal that electrically connects to the first connection terminal and a second thickness that is thinner than the first thickness and shallower than a depth of the cutout.

In another aspect, the present disclosure provides a rigid substrate, including: a core layer having a first surface and a second surface opposite to the first surface; a first internal wiring layer that is formed by a first insulating layer and a first wiring layer and is laminated on the first surface; and a second internal wiring layer that is formed by a second insulating layer and a second wiring layer and is laminated on the second surface, wherein a cutout is created by removing the first insulating layer and the core layer.

It is to be understood that both the foregoing general description and the following detailed description are exemplary and explanatory, and are intended to provide further explanation of the invention as claimed.

DETAILED DESCRIPTION OF EMBODIMENTS

Figure 1:
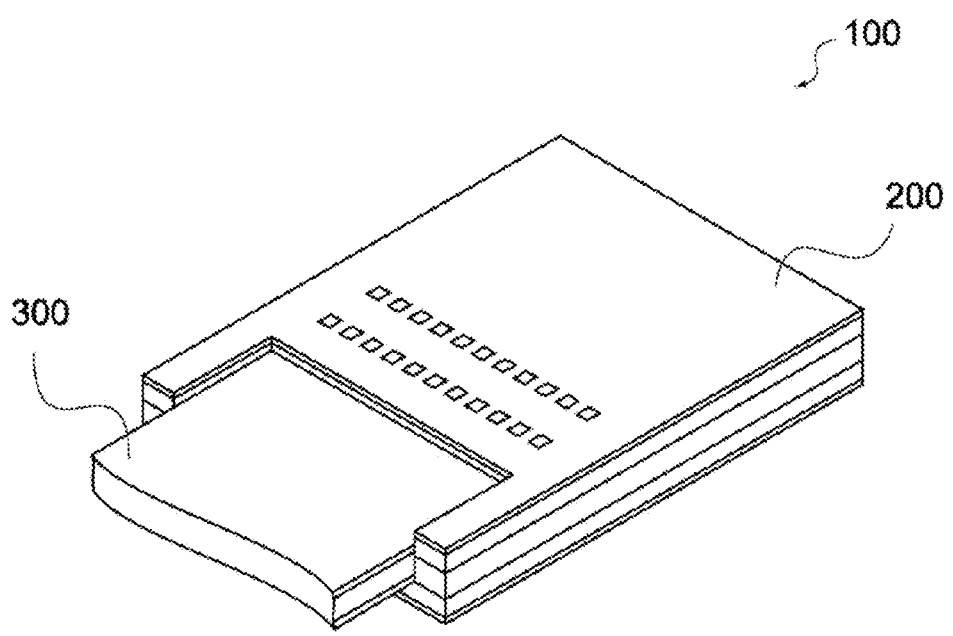
FIG. 1 is a perspective view of a composite substrate according to Embodiment 1 of the present invention.

A composite substrate according to one embodiment of the present invention includes a rigid substrate and a flexible substrate.

The rigid substrate is formed by laminating a core layer, an insulating layer, and a wiring layer together, and has a first thickness. The rigid substrate has a cutout in at least one of the four sides thereof, and a first connection terminal is exposed in the cutout.

The flexible substrate is joined to the cutout and has a second connection terminal that electrically connects to the first connection terminal. The flexible substrate has a second thickness that is thinner than the first thickness and shallower than the depth of the cutout.

According to this configuration, the flexible substrate joined to the rigid substrate is housed inside the cutout formed in the rigid substrate and does not protrude therefrom. Thus, the maximum thickness of the composite substrate does not exceed the thickness of the rigid substrate, and it is possible to prevent an increase in thickness of the composite substrate caused by joining the flexible substrate.

The first connection terminal may be formed by the wiring layer.

According to this configuration, the number of steps in the manufacturing process can be reduced because the wiring layer can be used as the connection terminal, thus eliminating the need for an additional connection terminal.

The core layer may be made of metal, and the first connection terminal may be formed by the core layer.

According to this configuration, the number of steps in the manufacturing process can be reduced because the core layer can be used as the connection terminal, thus eliminating the need for an additional connection terminal.

The first connection terminal may be formed by the wiring layer and a conductive layer laminated on the wiring layer.

According to this configuration, the surface of the connection terminal can either be on the same level as the surface of the insulating layer or be made to protrude from the surrounding insulating layer. Thus, joining a rigid substrate and a flexible substrate becomes possible using NCP or NCF, which is described later.

The composite substrate may further include a bonding layer made of a conductive member, which is arranged between the rigid substrate and the flexible substrate and establishes an electrical connection between the first connection terminal and the second terminal.

According to this configuration, the bonding layer can join the rigid substrate and the flexible substrate, thereby making it possible to establish an electrical connection between the rigid substrate and the flexible substrate.

The conductive member may be ACP (Anisotropic Conductive Paste) or ACF (Anisotropic Conductive Film).

ACP and ACF are insulating materials containing conductive particles. When heat and pressure are applied, insulating materials are pushed out, and an electrical connection is established by the leftover conductive particles. Thus, even if the first connection terminal and the second connection terminal are separated in space, it becomes possible to establish an electrical connection between the first connection terminal and the second connection terminal by placing a bonding layer made of ACP or ACF between the terminals.

The conductive member may be NCP (Non-anisotropic Conductive Paste) or NCF (Non-anisotropic Conductive Film).

NCP and NCF are insulating materials not containing conductive particles. When using these materials, an electrical connection is established between the two connection terminals by fixing the terminals while allowing them to touch each other. According to the configuration above, a conductive layer that increases the thickness of the first connection terminal is formed, and it becomes possible to physically connect the first and the second connection terminals. Thus, it becomes possible to use NCP or NCF as the bonding layer.

The rigid substrate includes: a core layer having a first surface on one side and a second surface on the opposite side; a first internal wiring layer that is formed by a first insulating layer and a first wiring layer and is laminated on the first surface; and a second internal wiring layer that is formed by a second insulating layer and a second wiring layer and is laminated on the second surface. The cutout may be created by removing the first insulating layer and the core layer.

A rigid substrate according to one embodiment of the present invention includes: a core layer having a first surface on one side and a second surface on the opposite side; a first internal wiring layer that is formed by a first insulating layer and a first wiring layer and is laminated on the first surface; and a second internal wiring layer formed by a second insulating later and a second wiring layer and laminated on the second surface. A cutout is created by removing the first insulating layer and the core layer.

Embodiment 1

A composite substrate according to Embodiment 1 of the present invention will be described.

Figure 2:
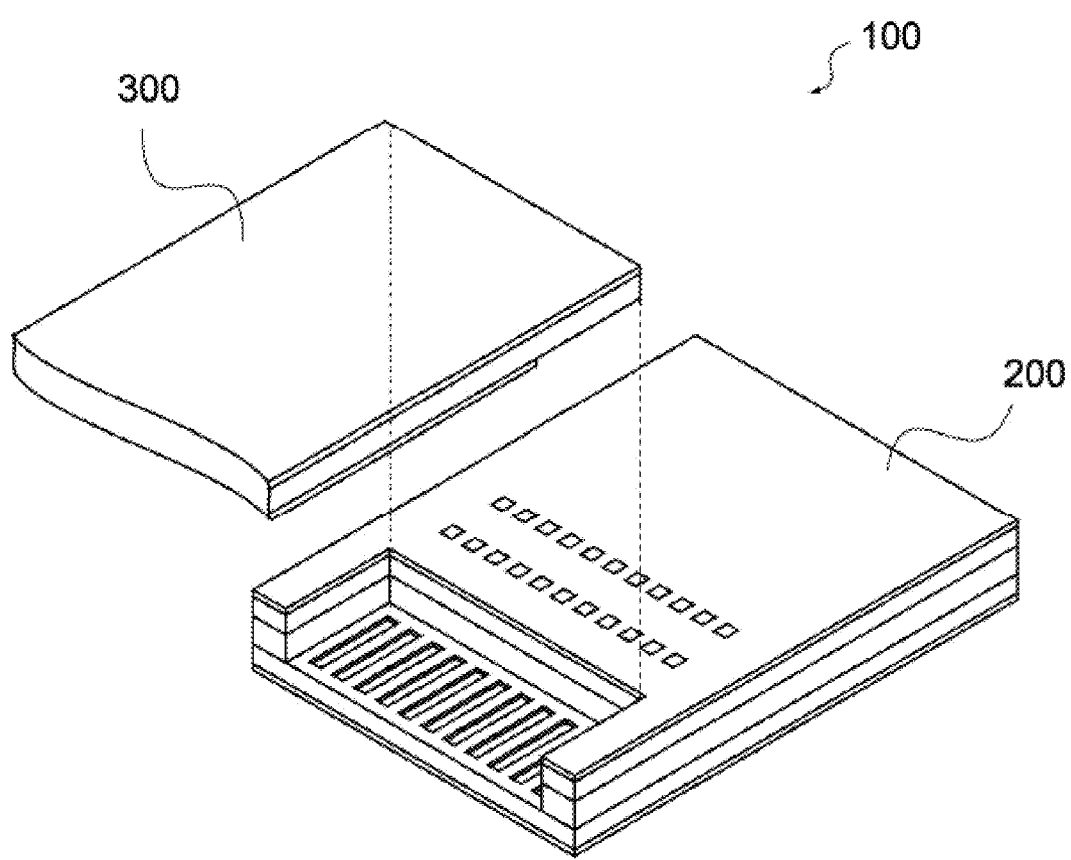
FIG. 2 is an exploded perspective view of the composite substrate.

FIG. 1 is a perspective view of a composite substrate 100 according to Embodiment 1 of the present invention. FIG. 2 is an exploded perspective view of the composite substrate 100. As FIGS. 1 and 2 show, the composite substrate 100 is formed by joining a rigid substrate 200 to a flexible substrate 300.

<Rigid Substrate>

Figure 3:
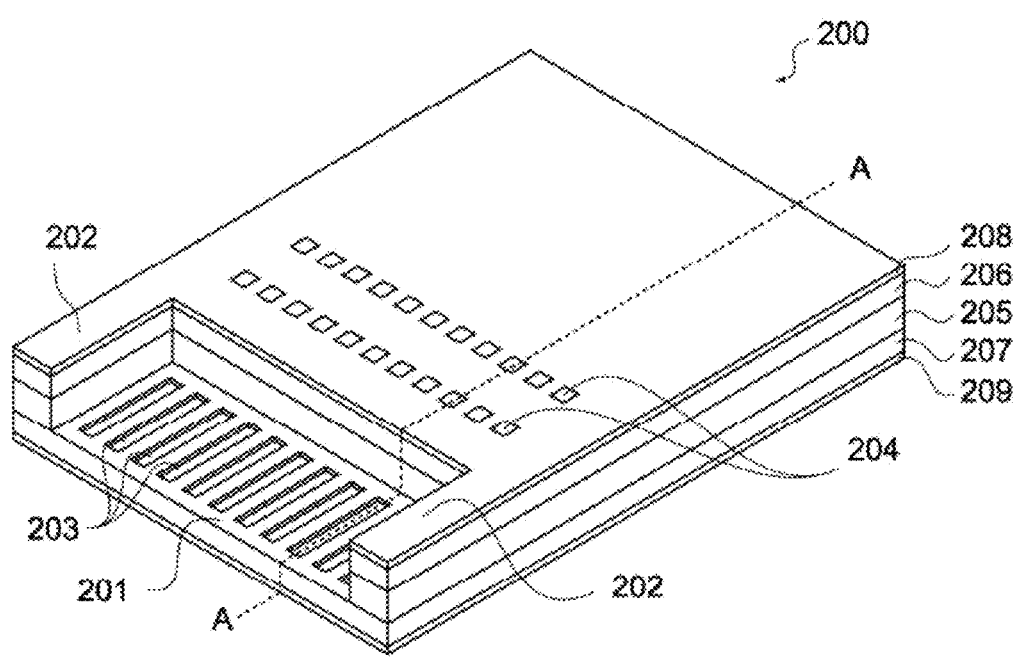
FIG. 3 is a perspective view of a rigid substrate forming a portion of the composite substrate.
Figure 4:
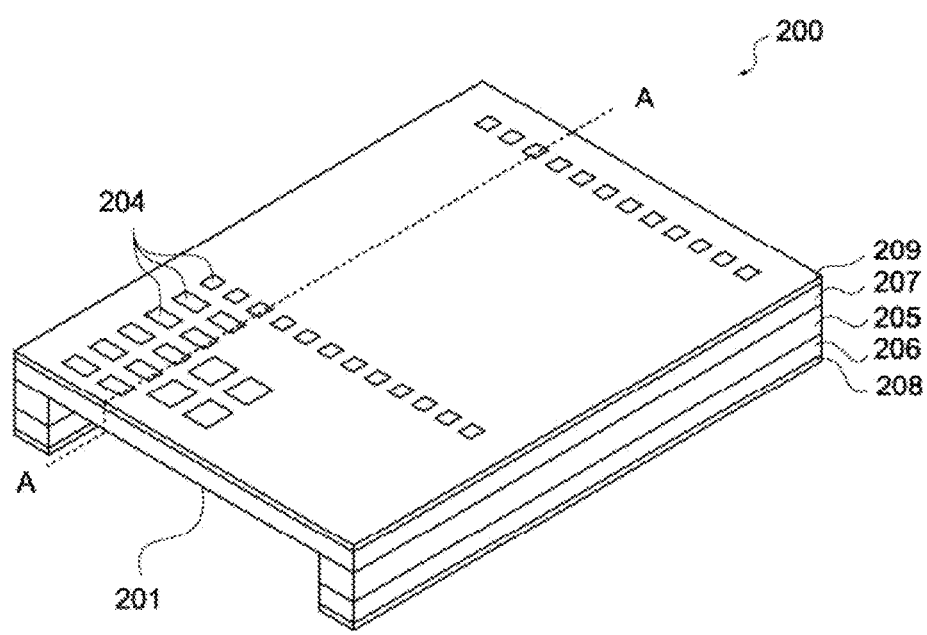
FIG. 4 is a perspective view of a rigid substrate forming a portion of the composite substrate.
Figure 5:
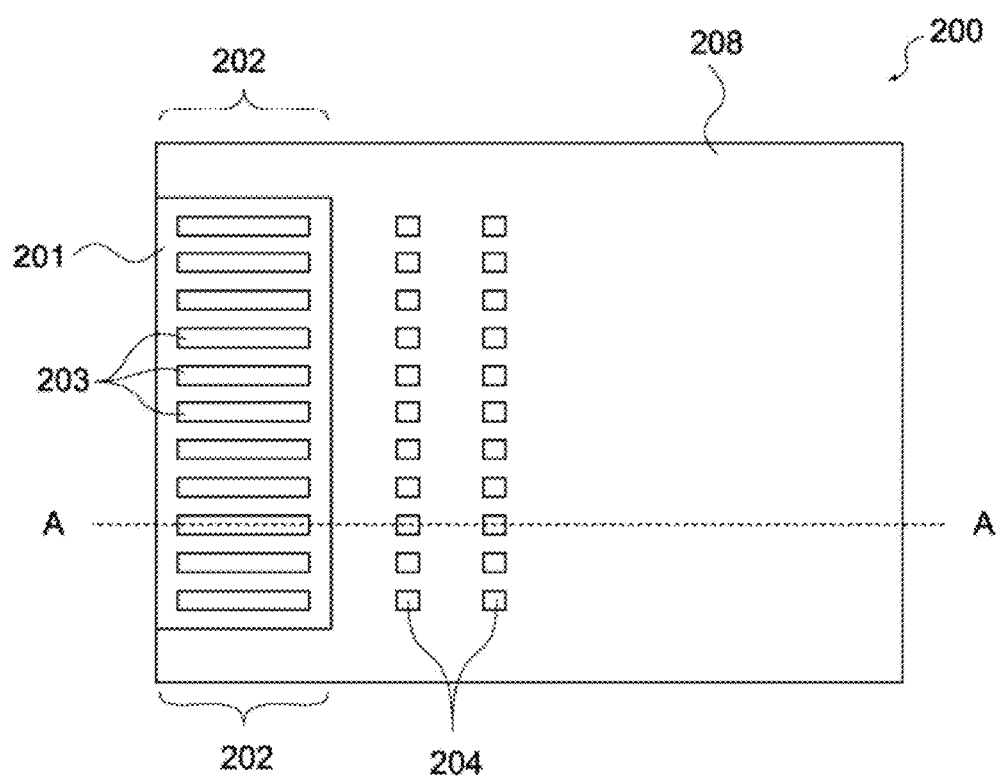
FIG. 5 is a plan view of a rigid substrate forming a portion of the composite substrate.
Figure 6:
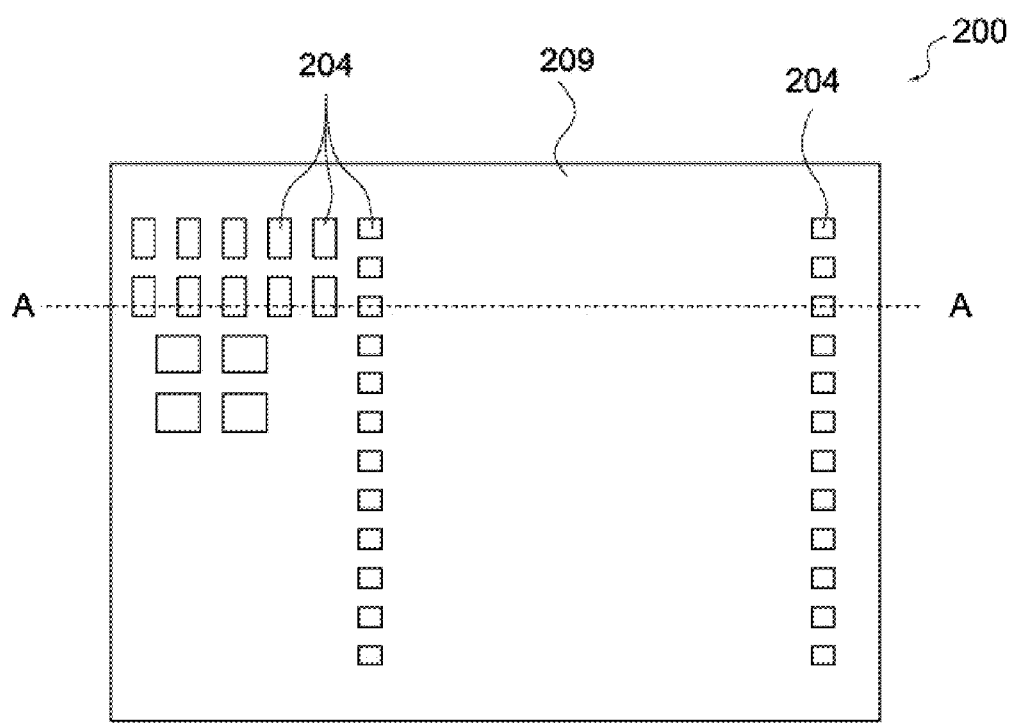
FIG. 6 is a plan view of a rigid substrate forming a portion of the composite substrate.
Figure 7:
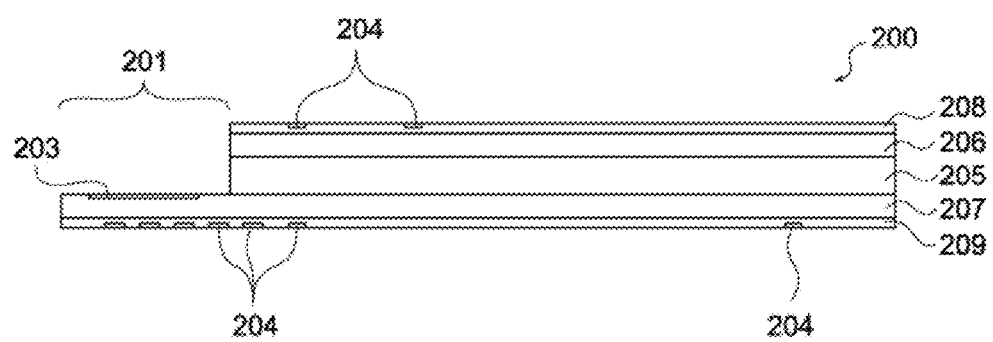
FIG. 7 is a cross-sectional view of a rigid substrate forming a portion of the composite substrate.

The rigid substrate 200 has a surface component (an integrated circuit, for example), which is described later, mounted thereon. Hereafter, the side of the rigid substrate 200 on which the flexible substrate 300 is joined is defined as the lower side, and the opposite side is defined as the upper side. FIG. 3 is a perspective view of the rigid substrate 200 seen from the lower side. FIG. 4 is a perspective view of the rigid substrate 200 seen from the upper side. FIG. 5 is a plan view showing the lower side of the rigid substrate 200. FIG. 6 is a plan view showing the upper side of the rigid substrate 200. FIG. 7 is a cross-sectional view of the rigid substrate 200 along a line A in FIGS. 3 to 6.

Although the rigid substrate 200 is not limited to a specific size, the length of the long side is 16 mm and the length of the short side is 10 mm, for example. The shape of the rigid substrate does not need to be rectangular and can be changed according to factors such as the layout of parts mounted on the rigid substrate 200.

As FIGS. 3 and 7 show, a cutout 201 is created in the rigid substrate 200. The cutout 201 is created in at least one of the four sides of the rigid substrate 200 and corresponds to the part where the rigid substrate 200 is hollowed out in the shape of a step. The method of forming the cutout 201 is described later. Although the cutout 201 is not limited to a specific size, the cutout width (long side) can be set to 8.24 mm, for example.

As FIG. 3 shows, walls 202 are disposed on both sides of the cutout 201. On the side of the rigid substrate 200 where the cutout 201 is formed, the walls 202 correspond to the portion where the cutout 201 is not formed. Although the walls 202 do not need to be formed, the walls 202 make it possible to maintain the strength of the rigid substrate 200.

As FIGS. 3 and 5 show, a connection terminal 203 is formed in the cutout 201. The connection terminal 203 can be formed on the surface in the cutout 201. The connection terminal 203 can include a plurality of terminals, each of which is separated by an insulator. The length of each terminal in the connection terminal 203 can be set to 0.7 mm, the width to 0.1 mm, and the distance between adjacent terminals to 0.1 mm, for example.

Figure 8:
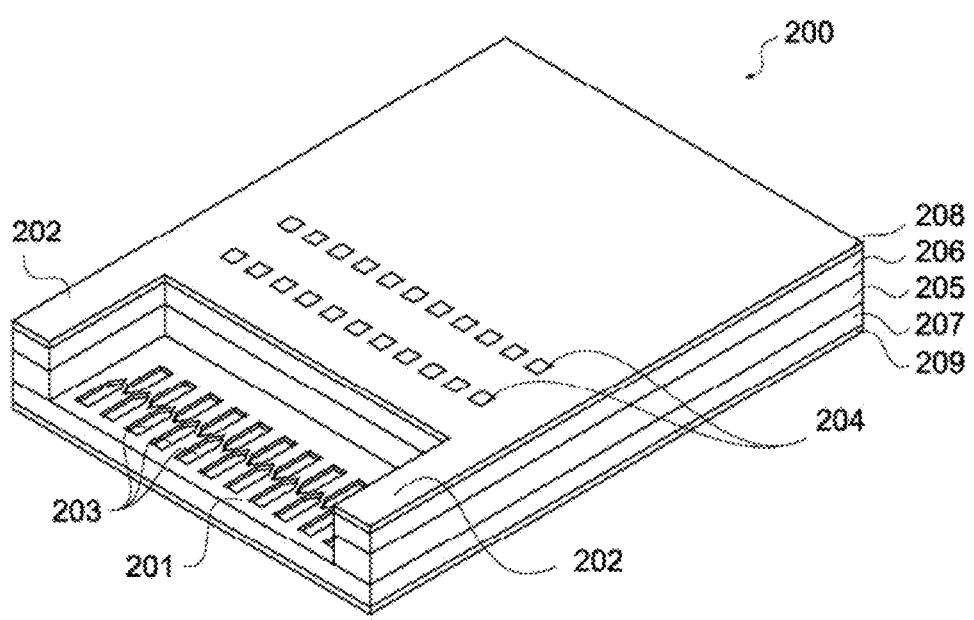
FIG. 8 is a perspective view of a rigid substrate forming a portion of the composite substrate.
Figure 9:
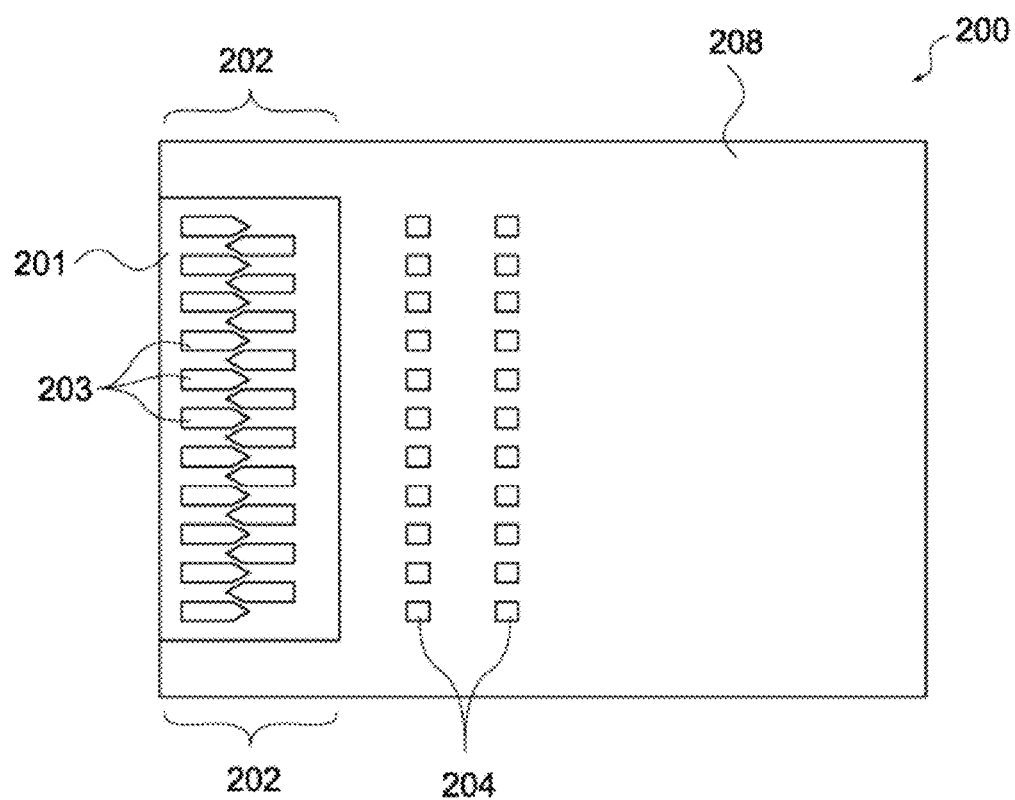
FIG. 9 is a plan view of a rigid substrate forming a portion of the composite substrate.

The shape and the number of the connection terminal 203 are not limited. FIGS. 8 and 9 are a perspective view and a plan view showing an alternative form of the connection terminals 203. As these figures show, the connection terminal 203 may be configured in multiple rows. In this case, the length of each terminal in the connection terminal 203 can be set to 0.4 mm, the width to 0.1 mm, and the distance between adjacent terminals to 0.1 mm, for example.

As FIGS. 5 and 6 show, connection pads 204 are disposed on the upper and the lower side of the rigid substrate 200. The connection pads 204 are parts used to establish an electrical connection with a surface component (described later) that is mounted on the upper and the lower side of the rigid substrate 200. The arrangement and the number of the connection pads 204 are not specifically limited, and the connection pads 204 are disposed according to the layout of the surface component. Alternatively, the connection pads 204 may be disposed on only the upper side or only the lower side of the rigid substrate 200.

Figure 10:
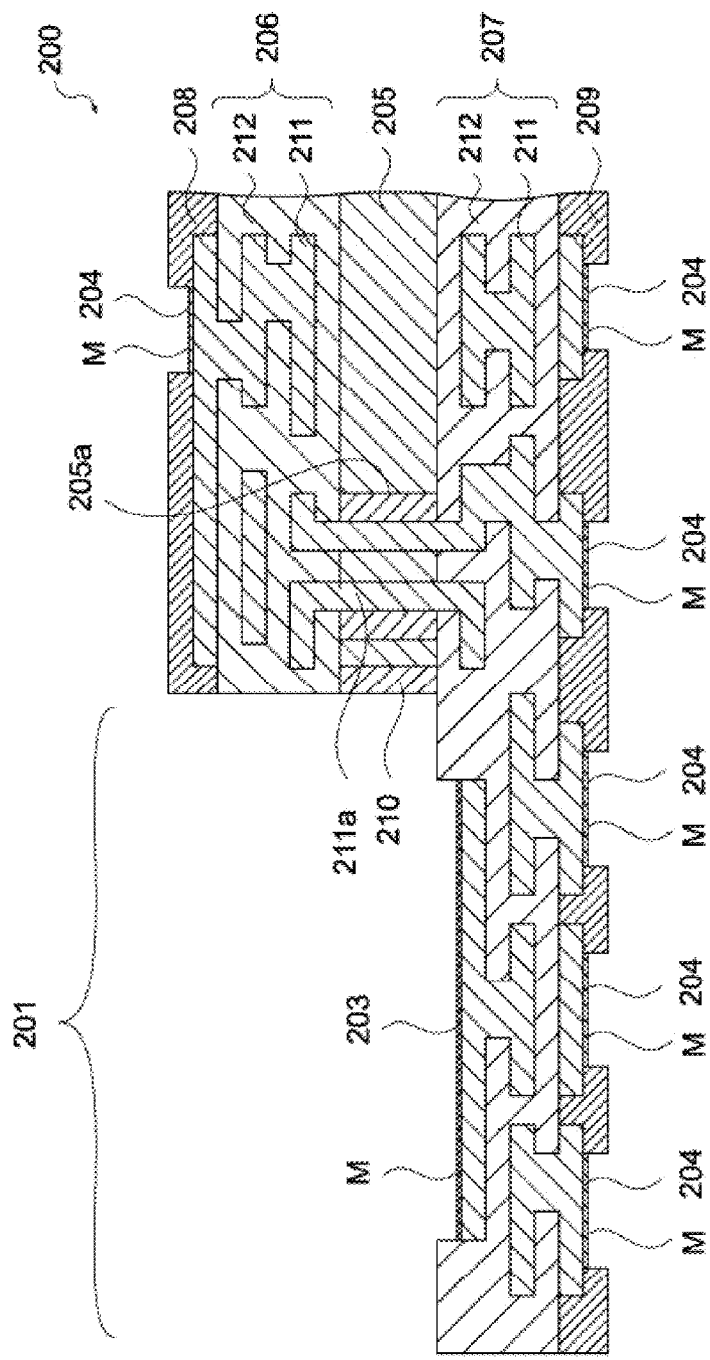
FIG. 10 is a cross-sectional view of a rigid substrate forming a portion of the composite substrate.

FIG. 10 is an enlarged view of FIG. 7 showing a section around the cutout 201 in the rigid substrate 200. As the figure shows, the rigid substrate 200 can be formed by laminating a core layer 205, a first internal wiring layer 206, a second internal wiring layer 207, a first solder resist layer 208, and a second solder resist layer 209.

The core layer 205 is made of metal such as copper or copper alloy and supports the laminate structure of the rigid substrate 200. The rigid substrate 200 can be formed by processing or forming a film on the core layer 205, for example. The core layer 205 can also function as ground for the rigid substrate 200. In addition, the core layer 205 can include a through hole 205a.

An insulating portion 210 made of an insulating material is disposed at the end of the core layer 205 on the cutout 201 side. Also, the insulating portion 210 can be formed around the through hole 205a. The insulating material can be epoxy resin, polyimide, bismaleimide triazine resin, and the like. An insulating material containing a reinforcing filler made of silicon dioxide, for example, may also be used.

The first internal wiring layer 206 is laminated on the lower side of the core layer 205 and formed by laminating a wiring layer 211 and an insulating layer 212. The wiring layer 211 is made of a conductive material such as copper and partially separated off by the insulating layer 212. Part of the wiring layer 211 is exposed from the first solder resist layer 208 and forms the connection pads 204. The wiring layer 211 functions as a signal line for the surface component, which is joined to the connection pads 204, or as a connection line for the surface component and ground (the core layer 205).

A plating layer M can be formed on the surface of the wiring layer 211 that forms the connection pads 204. The plating layer M can be made of Au or Cu. The thickness of the plating layer M can be set greater than or equal to 0.05 μm but no more than 1 μm, for example. As FIG. 10 shows, the wiring layer 211 may be made of a single layer or multiple layers. Also, as the figure shows, the wiring layer 211 can be electrically connected to other layers.

The insulating layer 212 is made of an insulating material. The insulating material can be epoxy resin, polyimide, bismaleimide triazine resin, and the like. An insulating material that contains a reinforcing filler made of silicon dioxide, for example, may also be used. The insulating material for the insulating layer 212 and that for the insulating portion 210 may be same or different.

The second internal wiring layer 207 is laminated on the upper side of the core layer 205 and formed by laminating a wiring layer 211 and an insulating layer 212 in a manner similar to the first internal wiring layer 206. Part of the wiring layer 211 is exposed from the second solder resist layer 209 and forms the connection pads 204. The wiring layer 211 functions as a signal line for the surface component, which is joined to the connection pads 204, or as a connection line for a surface component and ground (the core layer 205).

The second internal wiring layer 207 protrudes from the core layer 205 and the first internal wiring layer 206 and defines the surface of the cutout 201. Part of the wiring layer 211 in the second internal wiring layer 207 is exposed from the surface of the cutout 201 and forms the connection terminal 203 described above. A plating layer M can be formed on the surface of the wiring layer 211 that forms the connection terminal 203. The material for the plating layer M can be chosen according to the method of joining the rigid substrate 200 and the flexible substrate 300, which will be described later, and can be made of Au or Cu, for example.

The wiring layers 211 in the first internal wiring layer 206 and the second internal wiring layer 207 can be connected to each other. As FIG. 10 shows, by virtue of through hole wiring 211a placed inside the through hole 205a, an electrical connection can be established between the wiring layers 211 in the first internal wiring layer 206 and the second internal wiring layer 207 via the through hole wiring 211a.

The first solder resist layer 208 made of an insulating material is laminated on the first internal wiring layer 206. The insulating material can be epoxy resin, acrylic resin, polyimide, bismaleimide triazine resin, or the like. An insulating material containing a reinforcing filler made of silicon dioxide, for example, may also be used. The thickness of the first solder resist layer 208 can be set greater than or equal to 5 µm but no more than 70 µm, for example. The first solder resist layer 208 has an opening in a portion thereof, and the wiring layer 211 exposed from the opening forms the connection pads 204. When mounting the surface component on the connection pads 204, the first solder resist layer 208 acts as a solder resist for the solder for joining the surface component on the connection pads 204.

The second solder resist layer 209 made of an insulating material is laminated on the second internal wiring layer 207. Here, the same insulating material used for the first solder resist layer 208 can be used. The thickness of the second solder resist layer 209 can be set greater than equal to 5 µm but no more than 70 µm, for example. The second solder resist layer 209 has an opening in a portion thereof, and the wiring layer 211 exposed from the opening forms the connection pads 204. When mounting the surface component on the connection pads 204, the second solder resist layer 209 acts as a solder resist for the solder for joining the surface component on the connection pads 204.

The rigid substrate 200 is configured as above. The thickness of the rigid substrate 200 is described later.

<Flexible Substrate>

Figure 11:
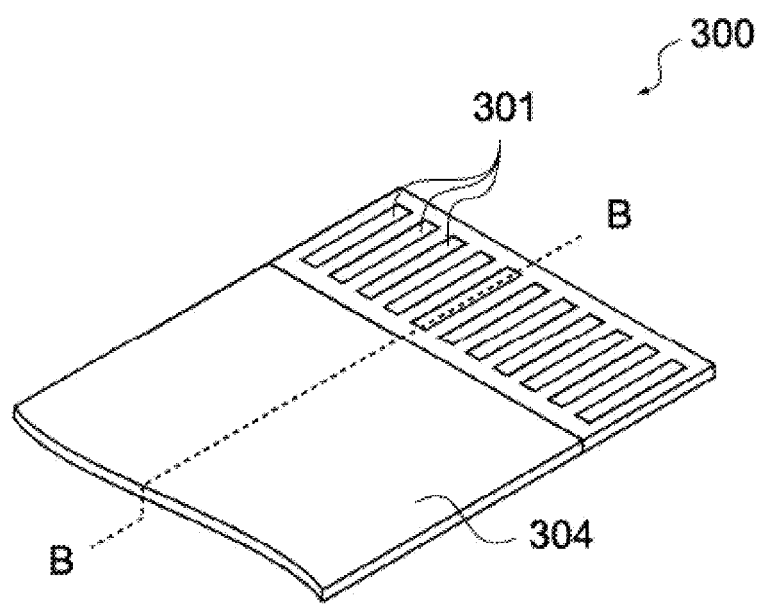
FIG. 11 is a perspective view of a flexible substrate forming a portion of the composite substrate.

A flexible substrate 300 is a flexible substrate, which contains wiring and the like embedded therein and establishes an electrical connection between the rigid substrate 200 and other electronic components (display, for example). FIG. 11 is a perspective view showing part of the flexible substrate 300 and the side that joins the rigid substrate 200.

Although the flexible substrate 300 is not limited to a specific size, as FIG. 2 shows, the width of the flexible substrate 300 can fit within the cutout 201. As FIG. 11 shows, a connection terminal 301 is formed on the flexible substrate 300. Once the flexible substrate 300 and the rigid substrate 200 are joined together, the connection terminal 301 is connected electrically to the connection terminal 203 of the rigid substrate 200. Thus, the connection terminal 301 is arranged according to the form and the number of the connection terminal 203.

Figure 12:
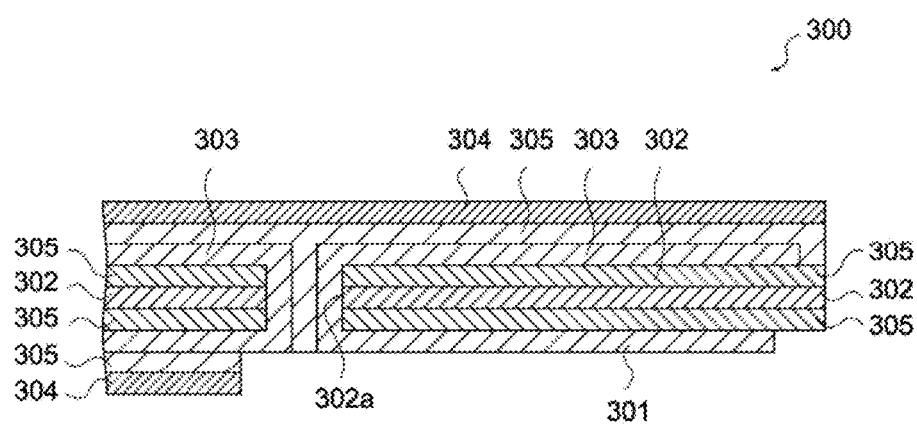
FIG. 12 is a cross-sectional view of a flexible substrate forming a portion of the composite substrate.

FIG. 12 is a cross-sectional view of the flexible substrate 300 along a line B-B in FIG. 11. As the figure shows, the flexible substrate 300 is formed by a base material 302, a wiring layer 303, a cover lay 304, and an adhesive layer 305.

The base material 302 is a base material for the flexible substrate 300 and is made of an insulating material such as polyimide. The thickness of the base material 302 can be such that the base material is flexible. The base material 302 can include a through hole 302a.

The wiring layer 303 is made of a conductive material such as copper and laminated on the base material 302 with an adhesive layer 305 in between. Part of the wiring layer 303 is exposed from the cover lay 304 and forms the connection terminal 301. A plating layer (not shown in the figure) may be formed on the surface of the wiring layer 303. The material for the plating layer can be chosen according to the method of joining the rigid substrate 200 and the flexible substrate 300, which will be described later, and can be made of Au, for example. The wiring layer 303 establishes an electrical connection via the through hole 302a.

The cover lay 304 is made of an insulating material and covers the wiring layer 303. The cover lay 304 is laminated on the wiring layer 303 with the adhesive layer 305 in between.

The adhesive layer 305 is a layer on which an adhesive material is hardened and serves as the bond between the base material 302 and the wiring layer 303 as well as the bond between the wiring layer 303 and the cover lay 304.

The flexible substrate 300 is configured as above. The thickness of the flexible substrate 300 is described later.

<Joining Rigid Substrate and Flexible Substrate>

Figure 13:
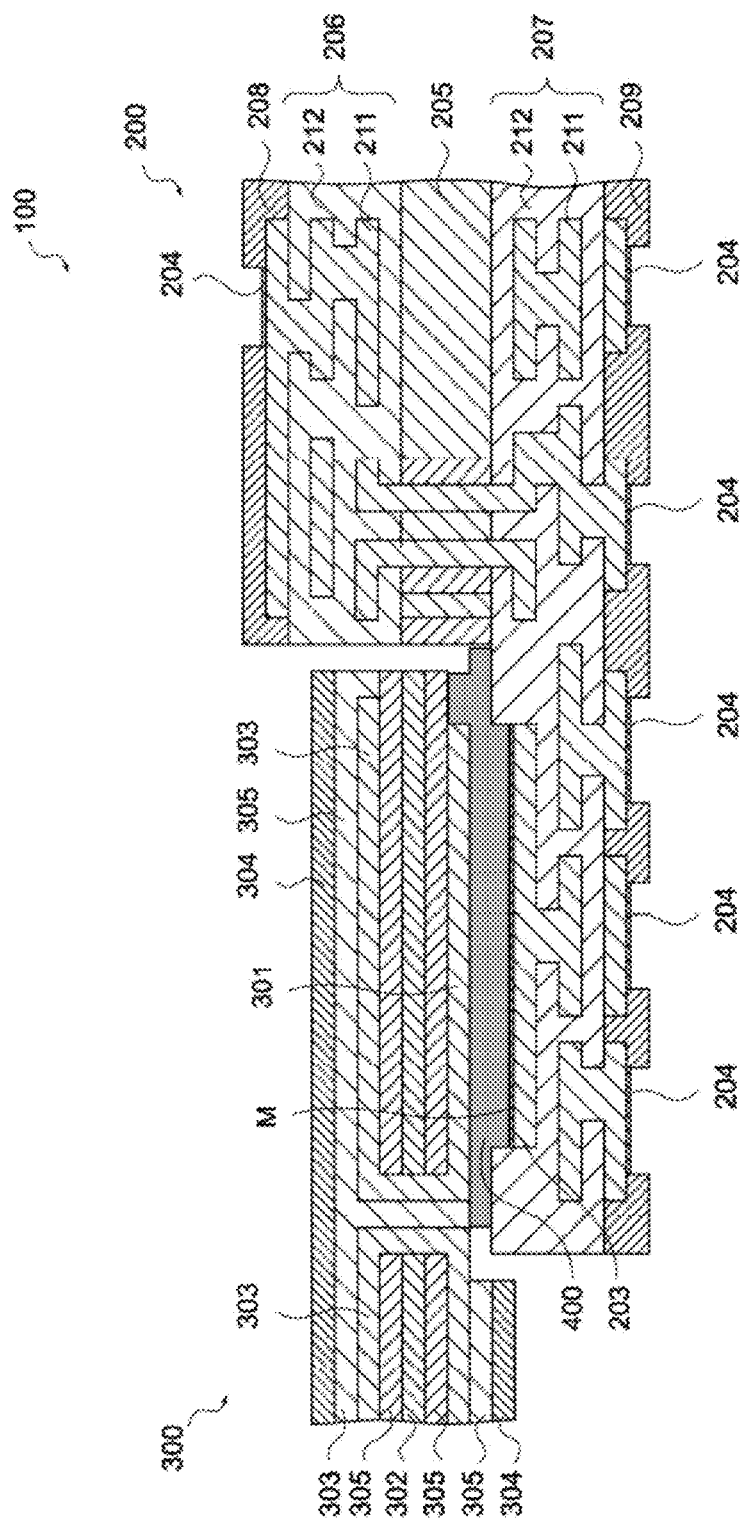
FIG. 13 is a cross-sectional view of the composite substrate.

As described above, the composite substrate 100 is formed by joining the rigid substrate 200 and the flexible substrate 300. FIG. 13 is an enlarged cross-sectional view of the composite substrate 100.

As the figure shows, the flexible substrate 300 and the rigid substrate 200 are joined together by a bonding layer 400. The bonding layer 400 fixes the rigid substrate 200 and the flexible substrate 300 and establishes an electrical connection between the connection terminals 203 of the rigid substrate 200 and the connection terminals 301 of the flexible substrate 300.

Specifically, the bonding layer 400 can be made of ACP (Anisotropic Conductive Paste). ACP is a material in a paste form, in which conductive particles are distributed in insulating resin. When the connection terminal 203 and the flexible substrate 300 press the ACP, the resin between the connection terminals 203 and 301 is squeezed out from the space between the terminals, and the conductive particles are left behind. In this circumstance, when the rigid substrate 200 and the flexible substrate 300 are further pressed toward each other, the conductive particles are crushed establishing an electrical connection between the terminals. The expelled resin fills the space between the terminals, thereby insulating adjacent terminals from each other.

Also, the bonding layer 400 may be made of ACF (Anisotropic Conductive Film). ACF is ACP in a film form and functions in a manner similar to ACP and establishes an electrical connection between the connection terminal 203 and the connection terminal 301.

When the bonding layer 400 is either ACP or ACF, the surfaces of both terminals need to be covered by Au. Thus, the material of the plating layer M of the connection terminal 203 can be Au. The connection terminal 301 can also be Au plated. Yet, the connection terminal 203 may be plated with Cu instead of Au.

As described above, the bonding layer 400 joins the rigid substrate 200 and the flexible substrate 300 to form the composite substrate 100.

<Thicknesses of Rigid Substrate and Flexible Substrate>

Figure 14:
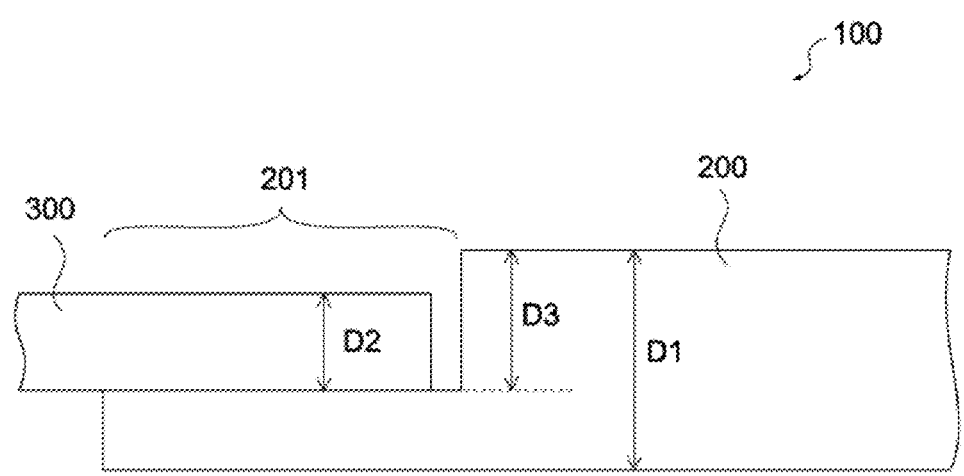
FIG. 14 is a diagram showing the relationship among various thicknesses of the composite substrate.

The thicknesses of the rigid substrate 200 and the flexible substrate 300 are described. FIG. 14 is a schematic cross-sectional view of the rigid substrate 200 and the flexible substrate 300. As the figure shows, the thickness of the rigid substrate 200 is defined as the first depth D1 and the thickness of the flexible substrate 300 is defined as the second depth D2. The depth of the cutout 201 is defined as the cutout depth D3.

Here, the second depth D2 is less than the first depth D1, and the second depth D2 is less than the cutout depth D3. Given these dimensions, the flexible substrate 300 does not protrude from the cutout 201, and the maximum thickness of the composite substrate 100 is no greater than the thickness of the rigid substrate 200.

Figure 15:
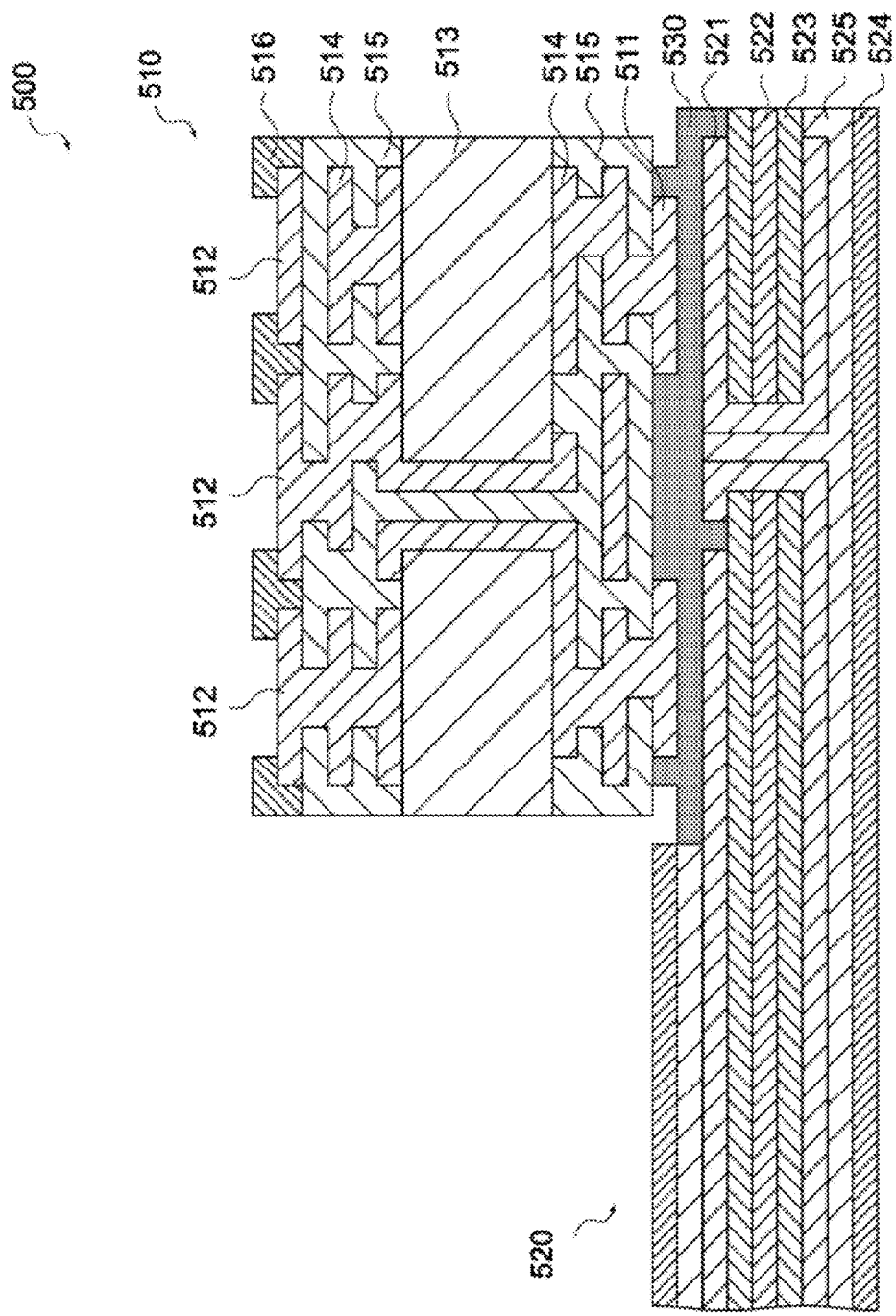
FIG. 15 is a cross-sectional view of the composite substrate according to a comparison example.
Figure 16:
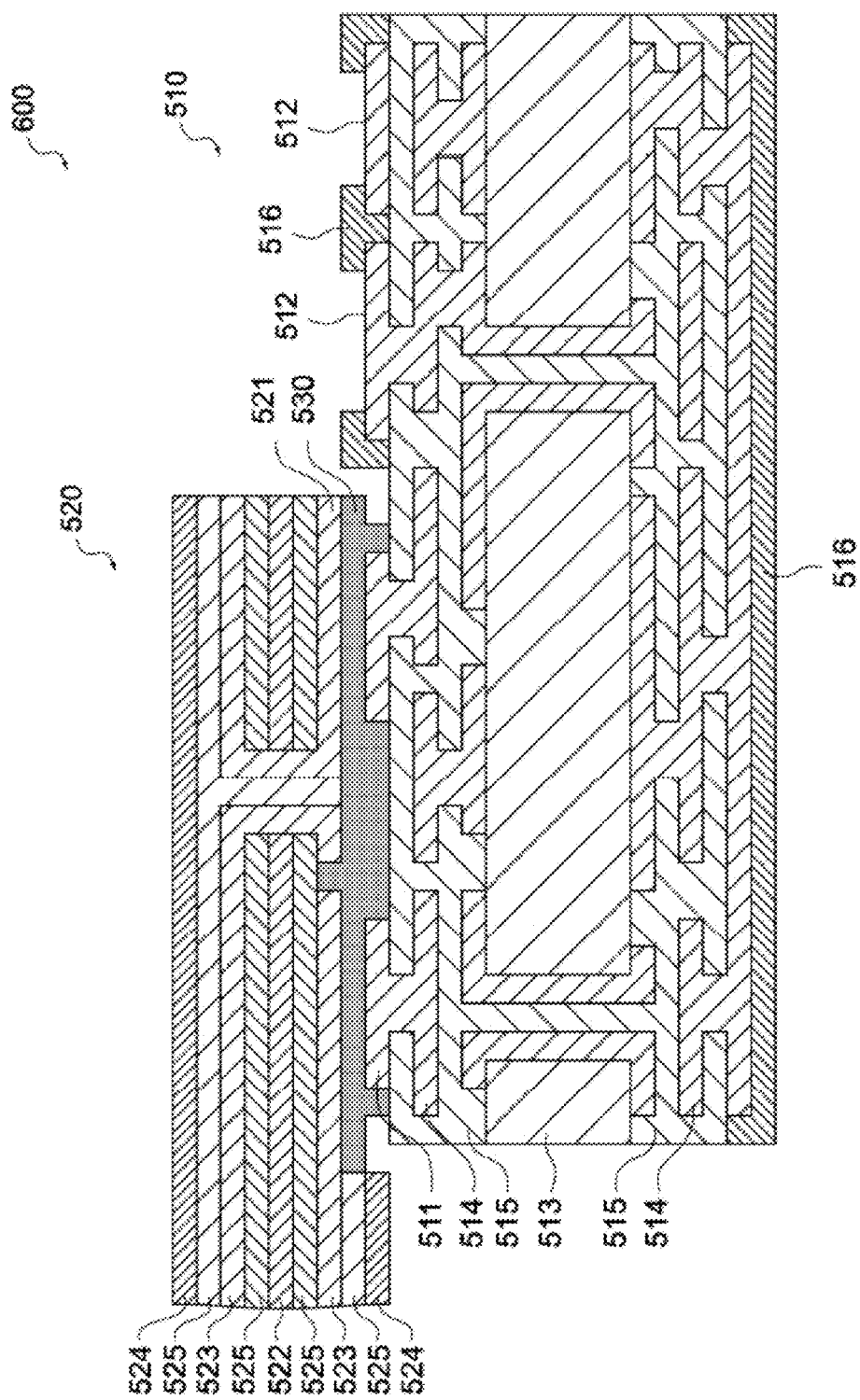
FIG. 16 is a cross-sectional view of the composite substrate according to a comparison example.

FIGS. 15 and 16 are cross-sectional views showing the structure of a composite substrate according to a comparison example. A composite substrate 500 shown in FIG. 15 and a composite substrate 600 shown in FIG. 16 are formed by a rigid substrate 510 and a flexible substrate 520 that are joined together by a bonding layer 530. The rigid substrate 510 is formed by a connection terminal 511, connection pads 512, a core layer 513, wiring layers 514, insulating layers 515, and a solder resist layer 516. The flexible substrate 520 is formed by a connection terminal 521, a base material 522, a wiring layer 523, a cover lay 524, and an adhesive layer 525.

In both of the structures shown in FIGS. 15 and 16, the maximum thickness of the composite substrate is the combined thickness of the rigid substrate 510 and the flexible substrate 520. In contrast, the maximum thickness of the composite substrate 100 according to the embodiment of the present invention is the thickness of the rigid substrate 200 as described above. Joining the rigid substrate 200 and the flexible substrate 300 does not increase the thickness of the composite substrate 100. In short, compared to the composite substrates having the structures shown in FIGS. 15 and 16, the thickness of the composite substrate 100 can be reduced.

<Mounting Surface Component>

Figure 17:
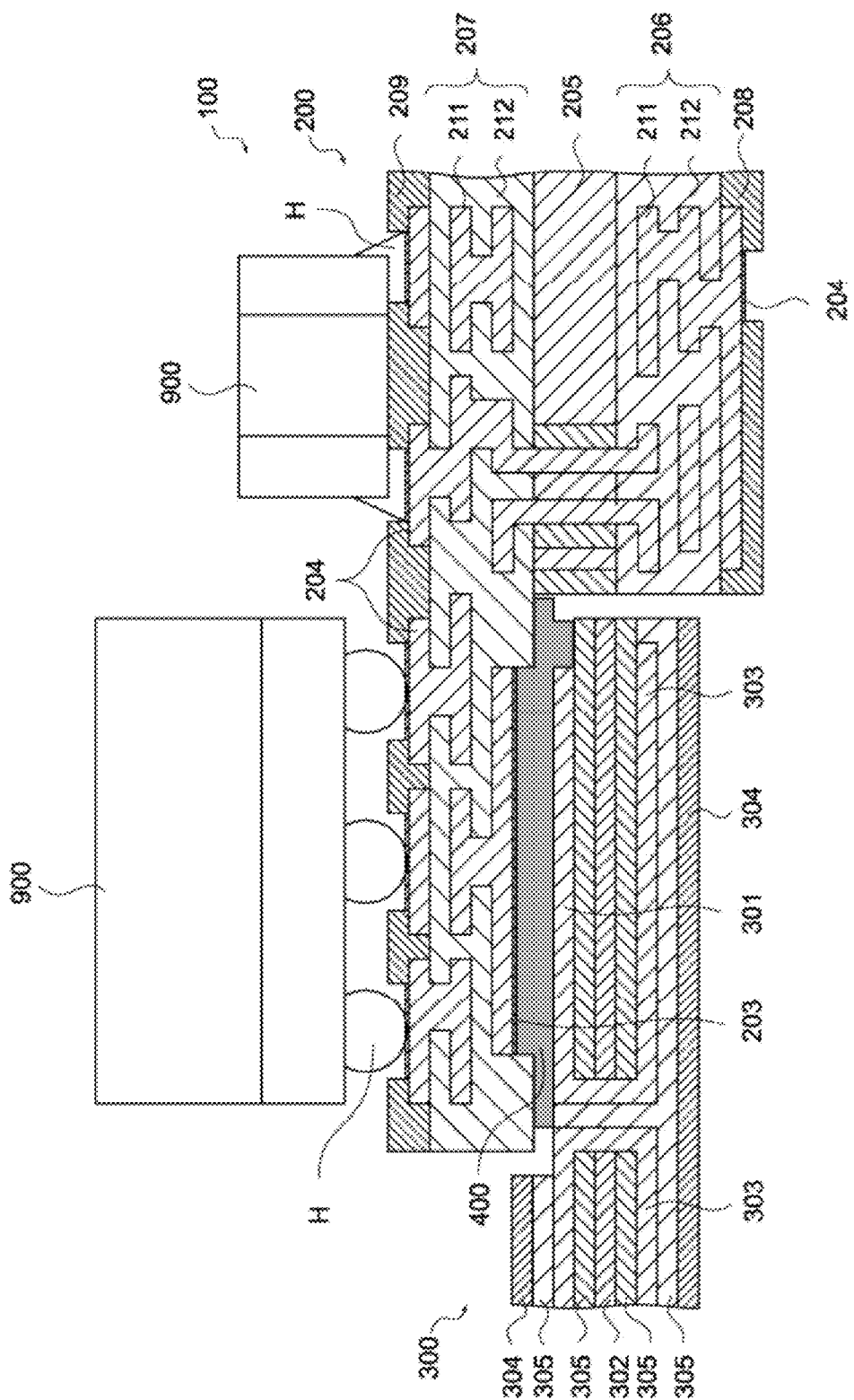
FIG. 17 shows a composite substrate according to Embodiment 1 of the present invention and is a cross-sectional view of a composite substrate on which a surface component is mounted.

A surface component is mounted on the composite substrate 100. FIG. 17 is a cross-sectional view showing the composite substrate 100 with a surface component 900 mounted thereon. As shown in the figure, the surface component 900 is joined to the connection pads 204 by solder H and electrically connected to the connection pads 204. The first solder resist layer 208 and the second solder resist layer 209 prevent melted solder H from leaking from the connection pads 204.

<Method of Manufacturing Composite Substrate>

A method of manufacturing the composite substrate 100 will be described. FIGS. 18A to 25 are diagrams showing the manufacturing process of the composite substrate 100.

Figure 18A:
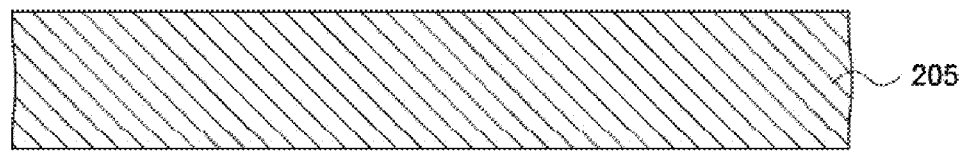
FIGS. 18A to 18C are diagrams showing a manufacturing process of the composite substrate.
Figure 18B:
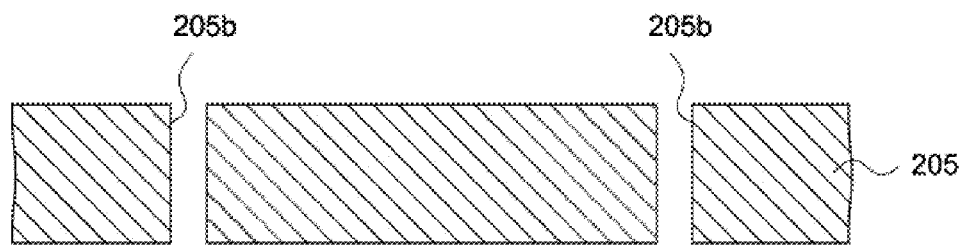

As FIG. 18A shows, a core layer 205 is prepared, and as FIG. 18B shows, through holes 205b are formed in the core layer 205. The through holes 205b can be formed by etching after covering the parts of the core layer 205 that do not correspond to the through holes 205b with an etch mask.

Figure 18C:
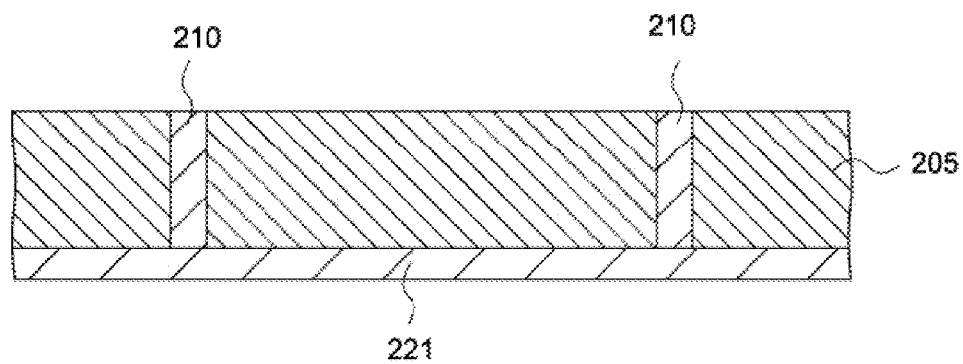

Then, as FIG. 18C shows, insulating portions 210 made of insulating material are formed inside the through holes 205b. First, a film 221 that temporarily fixes the core layer 205 is put on the entire surfaces of the core layer 205. Next, the through holes 205b are filled with curing agent (prepreg), which is an insulating material, and the insulating portions 210 are formed by hardening the curing agent by heating. The insulating materials can include epoxy resin, polyimide, bismaleimide triazine resin, or the like. Insulating materials containing a reinforcing filler made of silicon dioxide, for example, may also be used. The thickness of the insulating portions 210 can be set approximately between 30 µm and 200 µm, for example.

Figure 19A:
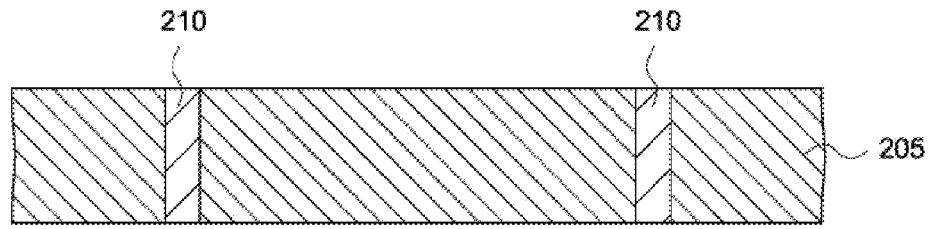
FIGS. 19A to 19C are diagrams showing a manufacturing process of the composite substrate.

Next, as FIG. 19A shows, the temporary film 221 is removed.

Figure 19B:
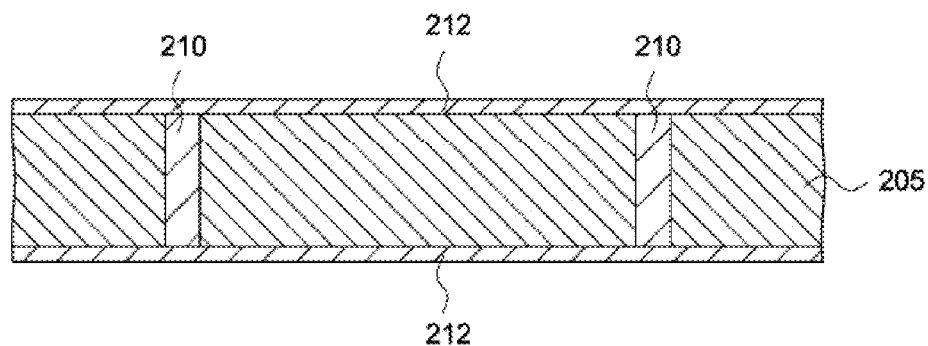

Next, as FIG. 19B shows, insulating layers 212 made of insulating material are formed on the top and the bottom surfaces of the core layer 205. The insulating materials can include epoxy resin, polyimide, bismaleimide triazine resin, or the like. Insulating materials containing a reinforcing filler made of silicon dioxide, for example, may also be used. The insulating material used here may be same or different as the insulating material used for the insulating portions 210. The thickness of the insulating layers 212 can be set approximately between 10 µm and 30 µm, for example. The insulating layers 212 can be formed by first placing sheets made of a curing agent (prepreg), which is an insulating material, on the top and the bottom surfaces of the core layer 205 and hardening the sheets by heating.

Figure 19C:
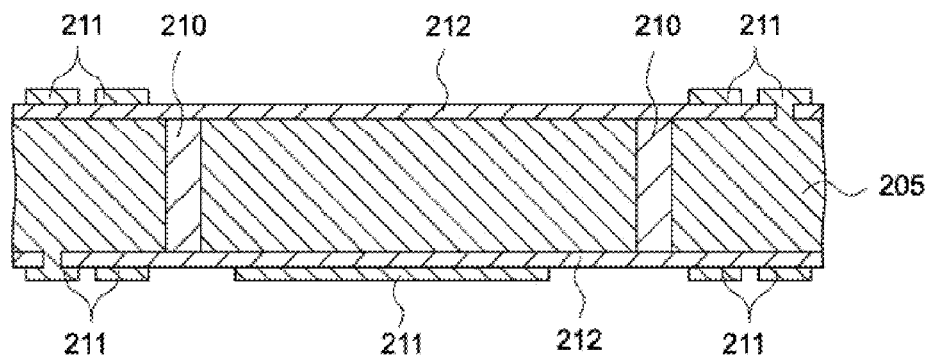

Then, as FIG. 19C shows, the wiring layers 211 are formed on the top and the bottom surfaces of the core layer 205. The wiring layers 211 can be made of conductive material such as copper or copper alloy. Specifically, the wiring layers 211 can be formed by first drilling a hole in the insulating layer 212 by lasers and the like, then performing electrolytic plating using the core layer 205 as the base material, and finally creating patterns on that plating layer. Patterns can be created by etching techniques such as photo etching, which uses etchants (like ferric chloride) on the copper or copper alloy, for example. Such etchants do not chemically react with the insulating layer 212. Thus, such etchants do not alter or roughen the surface of the insulating layers 212 during photo etching. The part of the wiring layers 211 connected to the core layer 205 functions as ground wiring, and those parts unconnected to the core layer 205 function as signal wiring.

Figure 20A:
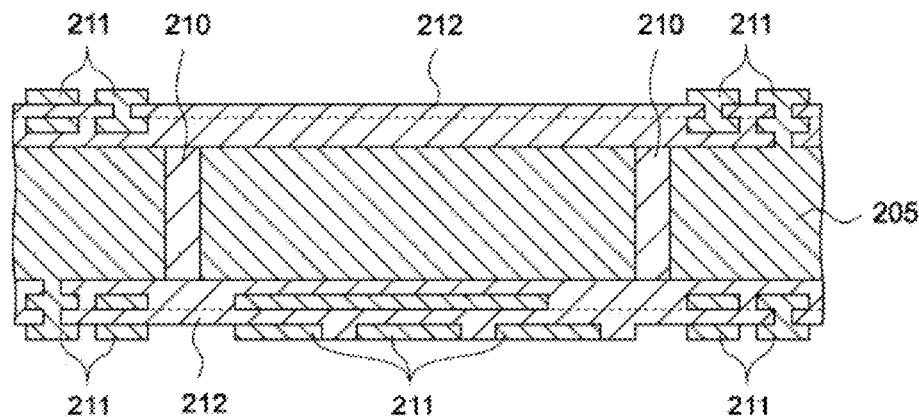
FIGS. 20A and 20B are diagrams showing a manufacturing process of the composite substrate.

Then, as FIG. 20A shows, the insulating layers 212 are formed further on the wiring layers 211. As described above, the insulating layers 212 can be formed by placing sheets made of insulating material and heating the sheets. Furthermore, as the figure shows, the wiring layers 211 are formed on the insulating layers 212. The wiring layers 211 can be formed by first drilling a hole in the insulating layer 212, then performing electrolytic plating, and finally creating patterns on that plating layer. Hereafter, the wiring layer 211 and the insulating layer 212 are alternately laminated in the same manner, and the number of the wiring layers 211 and the insulating layers 212 are set as desired. Out of all the wiring layers 211, the outermost layer forms the connection pads 204.

Figure 20B:
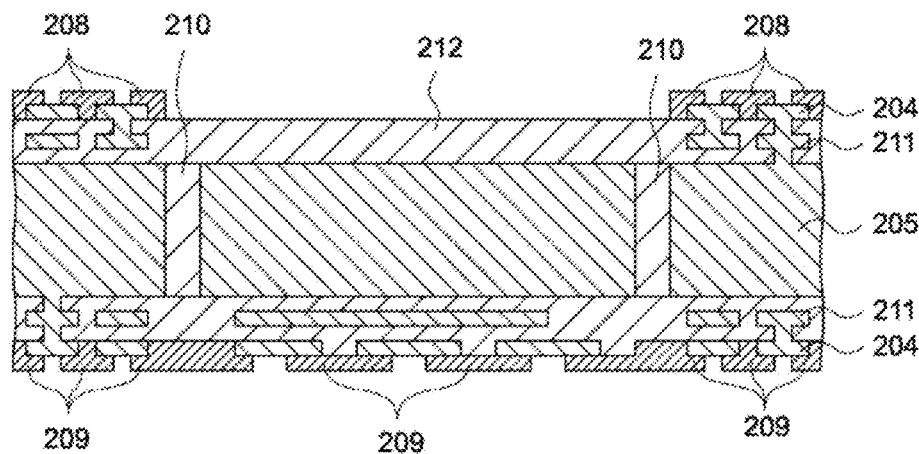

Next, as FIG. 20B shows, the first solder resist layer 208 and the second solder resist layer 209 are formed on the insulating layer 212 and the connection pads 204. Materials such as epoxy resin, acrylic resin, polyimide, and bismaleimide triazine resin can be used for the first solder resist layer 208 and the second solder resist layer 209. Insulating materials containing reinforcing filler made of silicon dioxide, for example, may also be used.

The thickness of the first solder resist layer 208 and the second solder resist layer 209 can be set greater than or equal to 5 μm but no more than 70 μm, for example. The first solder resist layer 208 and the second solder resist layer 209 can be formed by laminating materials on the insulating layer 212 and the connection pads 204 and creating patterns such that there is an opening on the connection pads 204. Methods of laminating materials can include vacuum lamination, for example. Patterns can be created by photo etching, for example.

Figure 21A:
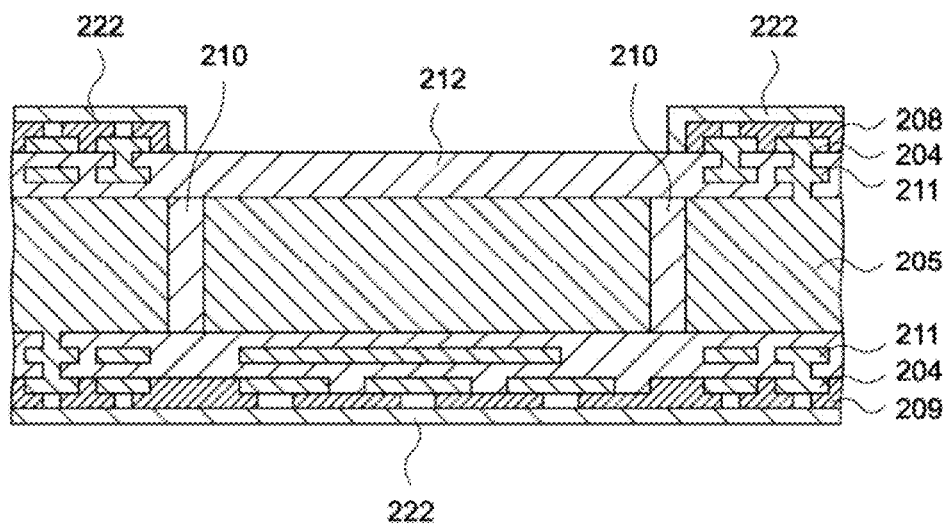
FIGS. 21A and 21B are diagrams showing a manufacturing process of the composite substrate.

Next, as FIG. 21A shows, protective resist layers 222 are formed on the first solder resist layer 208 and the second solder resist layer 209. The protective resist layers 222 can be made of epoxy resin, acrylic resin, polyimide, bismaleimide triazine resin, and the like. Insulating materials containing a reinforcing filler made of silicon dioxide, for example, may also be used. The thickness of the protective resist layers 222 can be set greater than or equal to 5 μm but no more than 75 μm, for example.

The protective resist layers 222 can be formed by laminating materials on the first solder resist layer 208 and the second solder resist layer 209 and creating patterns. Methods of laminating materials can include vacuum lamination, for example. Patterns can be created by photo etching, for example.

Figure 21B:
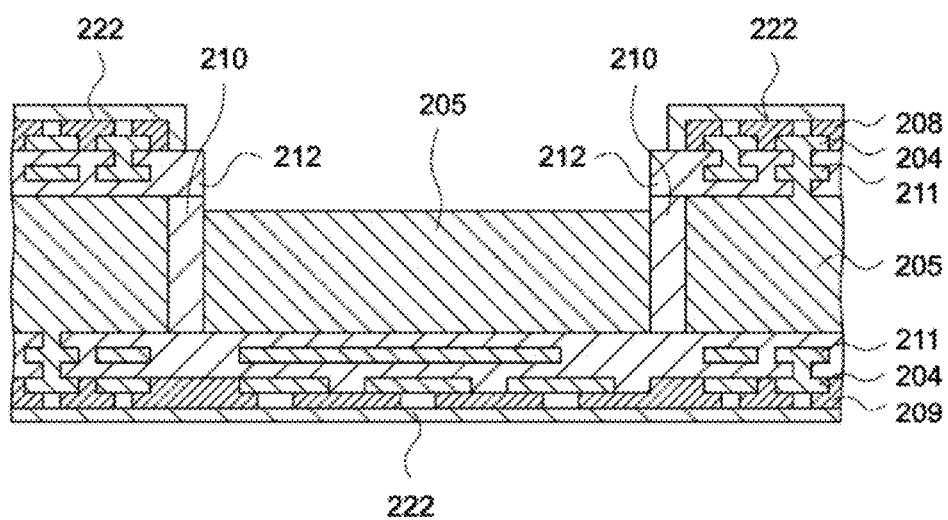

Next, as FIG. 21B shows, the insulating layer 212 is partly removed to expose the core layer 205. The insulating layer 212 can be removed by cutting the layer using a router (cutting tool). As the figure shows, it is preferable that the insulating layer 212 be cut such that the cut roughly reaches the surface of the core layer 205.

Figure 22A:
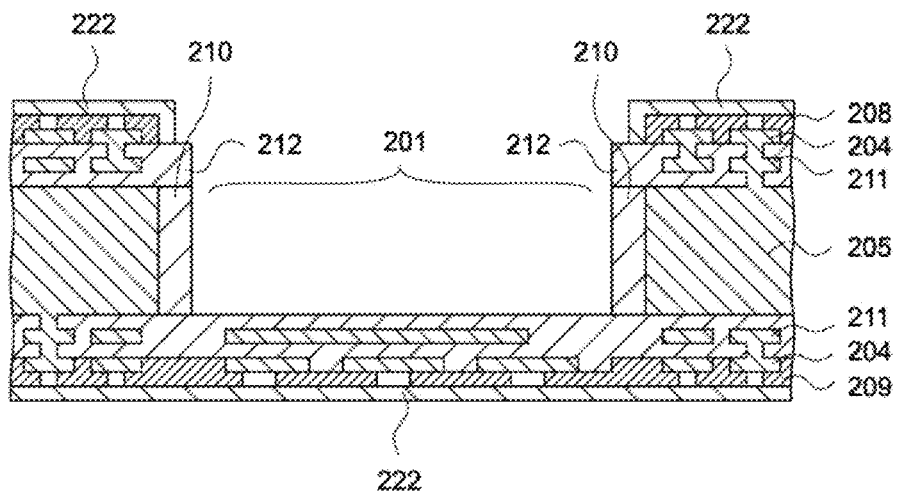
FIGS. 22A and 22B are diagrams showing a manufacturing process of the composite substrate.

Next, as FIG. 22A shows, the cutout 201 is formed. The cutout 201 can be formed by removing the core layer 205 by etching. Etchants such as ferric chloride do not chemically react with the insulating portions 210, the insulating layer 212, and the protective resist layer 222. Also, the connection pads 204 are protected from etchants by the protective resist layer 222. This setup makes it possible to remove only the portion of the core layer 205 located in between the insulating portions 210.

Figure 22B:
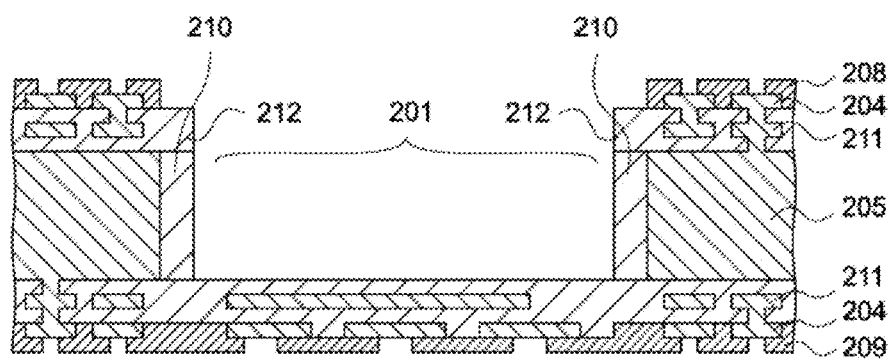

Next, as FIG. 22B shows, the protective resist layer 222 is removed. The protective resist layer 222 can be removed using resist removal solution. Sodium hydroxide or amine solutions can be used for the resist removal solution, for example.

Figure 23A:
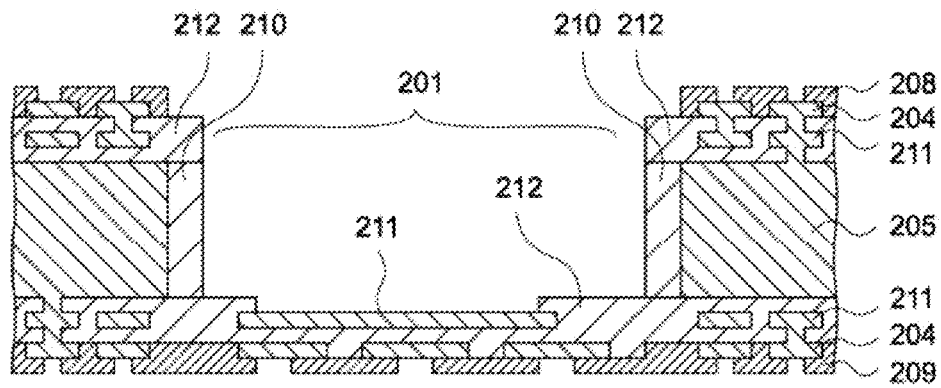
FIGS. 23A and 23B are diagrams showing a manufacturing process of the composite substrate.

Next, as FIG. 23A shows, the insulating layer 212 corresponding to the bottom surface of the cutout 201 is removed to expose the wiring layer 211 located below the insulating layer. The insulating layer 212 can be removed by irradiating the insulating layer 212 with a laser. The wiring layer 211 exposed from the insulating layer 212 forms the connection terminal 203.

Figure 23B:
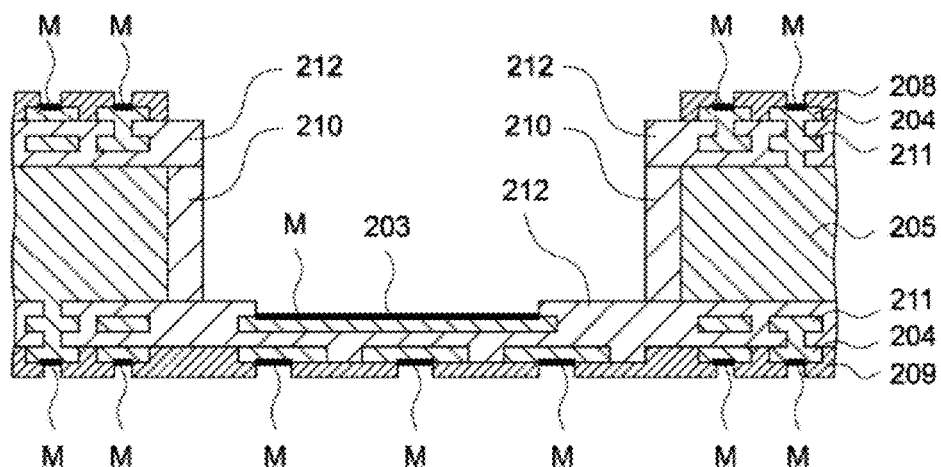

Next, as FIG. 23B shows, the plating layer M is formed on the surface of the wiring layer 211, which forms the connection pads 204 and the connection terminal 203. The plating layer M can be made of Au.

Figure 24A:
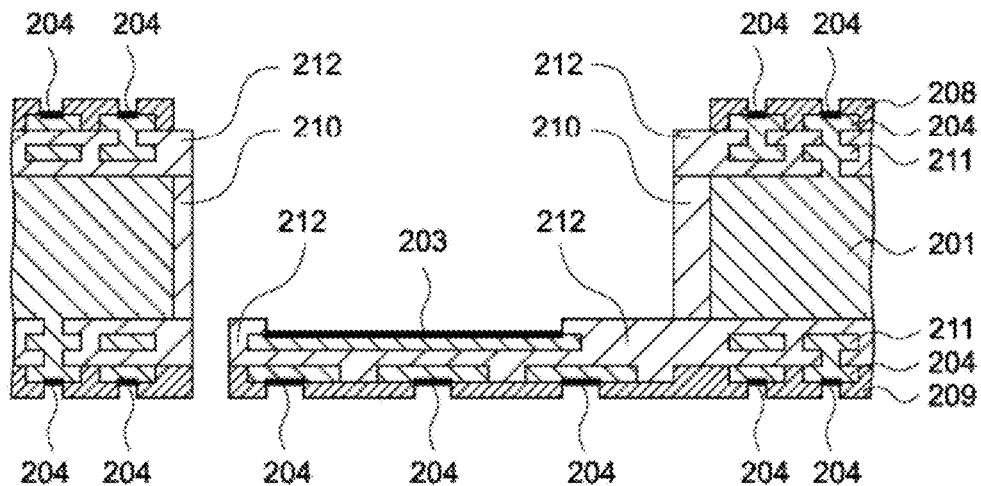
FIGS. 24A and 24B are diagrams showing a manufacturing process of the composite substrate.

Next, as FIG. 24A shows, the insulating layer 212 and the second solder resist layer 209 are cut at a point between the insulating portion 210 and the connection terminal 203. The cut can be made by a dicer. From this, the rigid substrate 200 shown in FIG. 10 is formed.

Figure 24B:
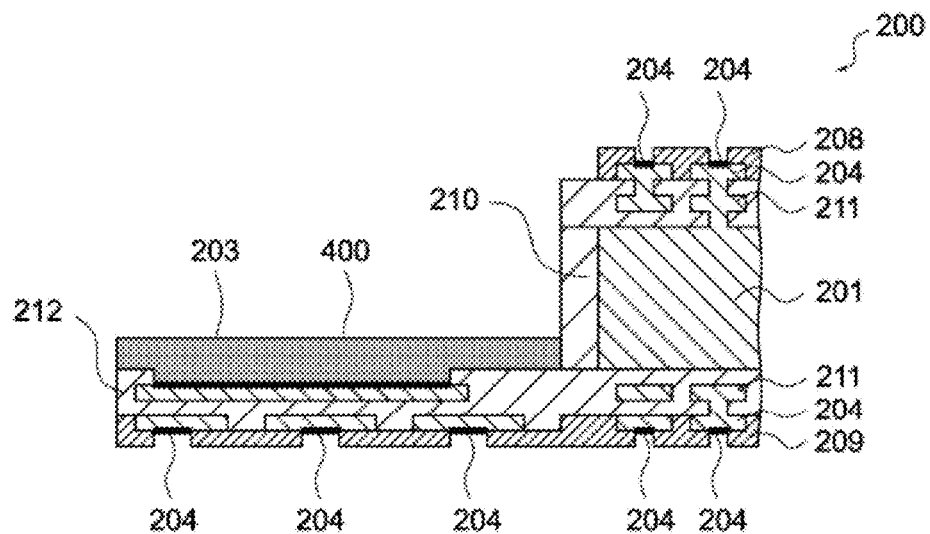

Next, as FIG. 24B shows, the bonding layer 400 is arranged on the connection terminal 203 and the insulating layer 212 located around the connection terminal. The bonding layer 400 is arranged by applying ACP using a dispenser or by placing an ACF.

Next, the flexible substrate 300 is placed on the bonding layer 400 to join the rigid substrate 200 and the flexible substrate 300 by heating and to establish an electrical connection between the connection terminal 203 and the connection terminal 301. From this, the composite substrate 100 shown in FIG. 13 is formed.

The composite substrate 100 can be produced by the procedure described above.

Embodiment 2

A composite substrate according to Embodiment 2 of the present invention is described. In the present embodiment, the same reference characters are used to designate configurations that are the same as those in Embodiment 1, and a description thereof is omitted.

In a manner similar to Embodiment 1, the composite substrate according to the present embodiment is formed by joining a rigid substrate and a flexible substrate.

<Composite Substrate>

Figure 25:
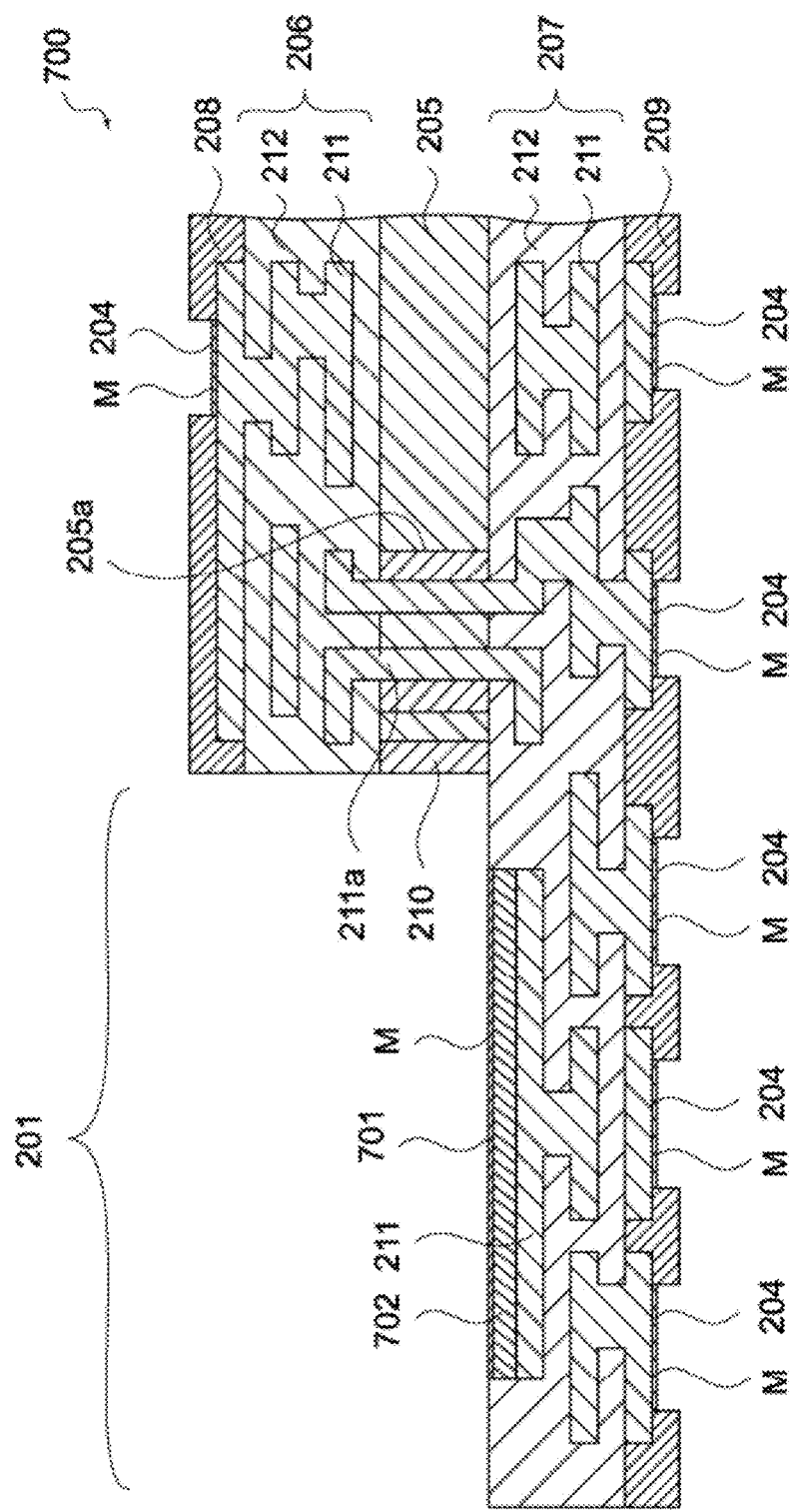
FIG. 25 is a cross-sectional view of a rigid substrate forming a portion of a composite substrate according to Embodiment 2 of the present invention.

FIG. 25 is an enlarged cross-sectional view of a rigid substrate 700 according to the present embodiment. In a manner similar to the rigid substrate 200 according to Embodiment 1, the rigid substrate 700 is an inflexible substrate on which a surface component is mounted. A cutout 201 is formed in the rigid substrate 700. The shape and the depth of the cutout 201 is the same as those in Embodiment 1.

In a manner similar to Embodiment 1, the rigid substrate 700 is formed by laminating a core layer 205, a first internal wiring layer 206, a second internal wiring layer 207, a first solder resist layer 208, and a second solder resist layer 209. The first internal wiring layer 206 and the second internal wiring layer 207 are formed by laminating a wiring layer 211 and an insulating layer 212. Also, part of the wiring layer 211 forms connection pads 204.

The rigid substrate 700 includes a connection terminal 701. The connection terminal 701 is formed by the wiring layer 211 and a conductive layer 702 laminated on the wiring layer 211. The conductive layer 702 is made of conductive material and can be Ni plating, for example. Other than Ni plating, the conductive layer 702 can also be made of a metal or a conductive resin. The thickness of the conductive layer 702 can be set greater than or equal to 3 μm but no more than 30 μm, for example.

A plating layer M can be formed on the surface of the conductive layer 702. The material for the plating layer M can be chosen according to the method of joining the rigid substrate 200 and the flexible substrate 300, which will be described later, and can be made of Au or Cu, for example. It is preferable that the combined thickness of the conductive layer 702 and the plating layer M be such that the top surface of the plating layer M is either the same as that of the insulating layer 212 or protruding a few micrometers from the top of insulating layer 212.

The rigid substrate 700 is configured as above. The shape and the thickness of the rigid substrate 700 are same as the rigid substrate 200 according to Embodiment 1. In short, the rigid substrate 700 has a first thickness D1 and the cutout 201 has a depth D3 (see FIG. 14).

<Flexible Substrate>

Figure 26:
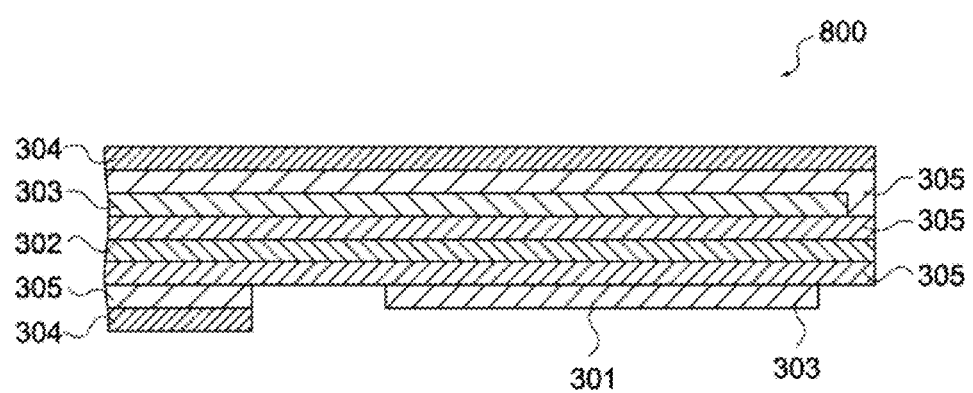
FIG. 26 is a cross-sectional view of a flexible substrate forming a portion of the composite substrate.

FIG. 26 is an enlarged cross-sectional view of a flexible substrate 800 according to the present embodiment. The flexible substrate 800 is a flexible substrate containing wiring and the like embedded therein and establishes an electrical connection between the rigid substrate 200 and other electronic components (display, for example).

In a manner similar to the flexible substrate 300 according to Embodiment 1, the flexible substrate 800 is formed by laminating a base material 302, a wiring layer 303, a cover lay 304, and an adhesive layer 305. In the flexible substrate 800, part of the wiring layer 303 protrudes from the adhesive layer 305 forming a connection terminal 301.

The flexible substrate 800 is configured as above. The shape and the thickness of the flexible substrate 800 are same as the flexible substrate 300 according to Embodiment 1. In short, the flexible substrate 300 has a second thickness D2 (See FIG. 14).

<Joining Rigid Substrate and Flexible Substrate>

Figure 27:
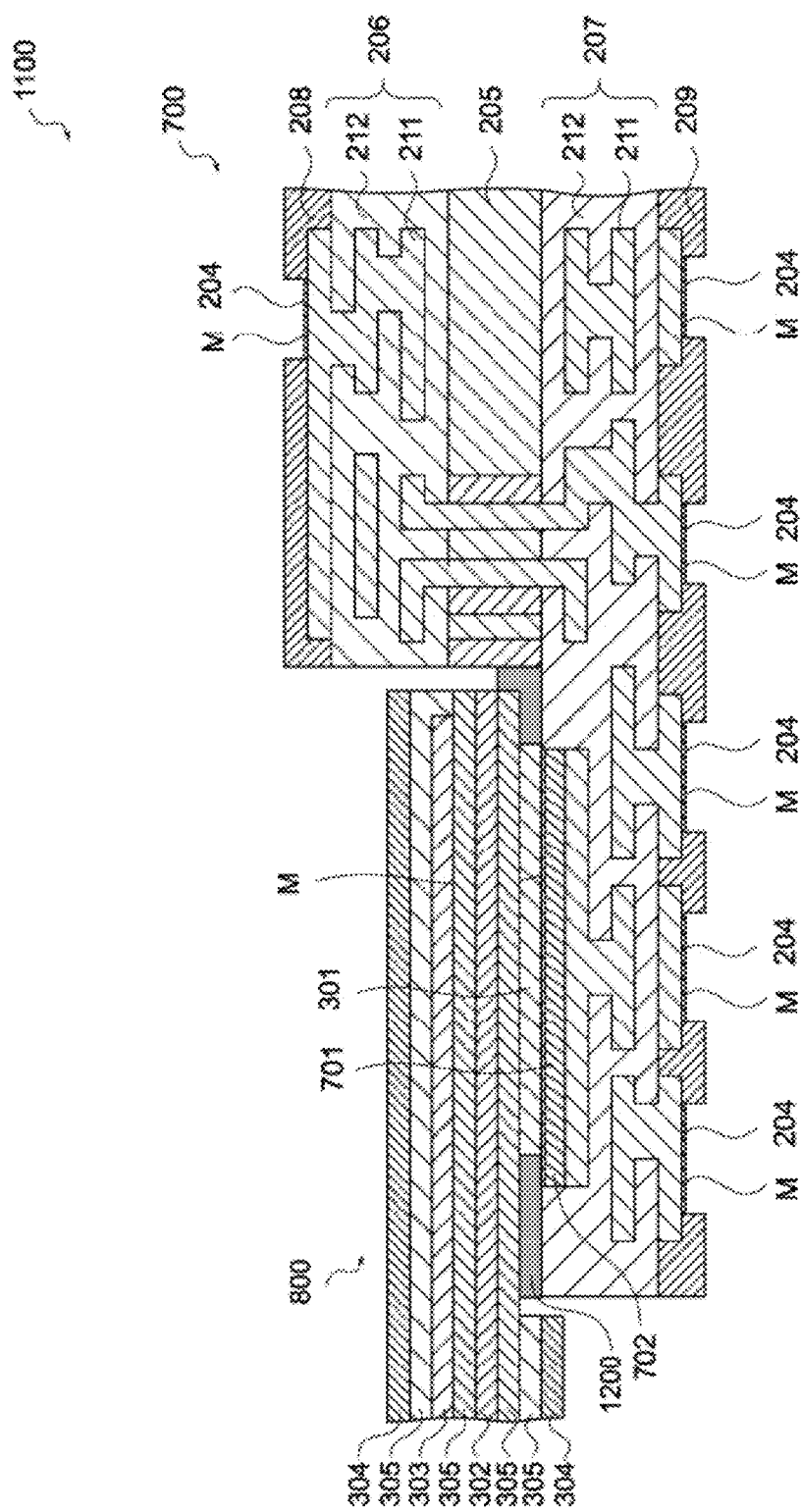
FIG. 27 is a cross-sectional view of the composite substrate.

As described above, the flexible substrate 800 is joined to the rigid substrate 700 to form a composite substrate 1100. FIG. 27 is an enlarged cross-sectional view of the composite substrate 1100.

As the figure shows, the flexible substrate 800 and the rigid substrate 700 are joined together by a bonding layer 1200. The bonding layer 1200 fixes the rigid substrate 700 and the flexible substrate 800 and establishes an electrical connection between the connection terminals 701 of the rigid substrate 700 and the connection terminals 301 of the flexible substrate 800.

The bonding layer 1200 can be made of NCP (Non-anisotropic Conductive Paste). NCP made of an insulating resin fixes the flexible substrate 800 and the rigid substrate 700, thereby allowing the connection terminals 701 and 301 to touch each other and establishing an electrical connection between them. In the rigid substrate 700, because the conductive layer 702 is laminated on the connection terminal 701, the connection terminal 701 physically touches the connection terminal 301. Thus, NCP can be used for the bonding layer 1200.

Also, the bonding layer 1200 may be made of NCF (Non-anisotropic Conductive Film). NCF is NCP in a film form and functions in a manner similar to NCP to establish an electrical connection between the connection terminal 701 and the connection terminal 301.

ACP or ACF can also be used for the bonding layer 1200. In this case, conductive particles contained in ACP or ACF remain in the space between the connection terminals 701 and 301, thereby establishing an electrical connection between them.

When NCP or NCF is used for the bonding layer 1200, the surface of the terminals to be connected electrically need to be covered by Cu. Thus, the material of the plating layer M of the connection terminal 701 can be Cu. Since the connection terminal 301 can be made of copper, a plating layer is unnecessary for the connection terminal 301. When ACP or ACF is used for the bonding layer 1200, Au can be used for the plating layer M of the connection terminal 701, and the surface of the connection terminal 301 can also be Au plated.

As described above, the bonding layer 1200 joins the rigid substrate 700 and the flexible substrate 800 to form the composite substrate 1100. In a manner similar to Embodiment 1, a surface component can be mounted on the connection pads 204 of the composite substrate 1100.

<Method of Manufacturing Composite Substrate>

The method of manufacturing the composite substrate 1100 is described. FIGS. 28A to 29B are diagrams showing the manufacturing process of the composite substrate 1100. Since the manufacturing process from the point at which the cutout 201 is formed to the point at which the insulating layer corresponding to the bottom of the cutout 201 is removed (FIG. 23A) is the same as in Embodiment 1, the description thereof is omitted.

Figure 28A:
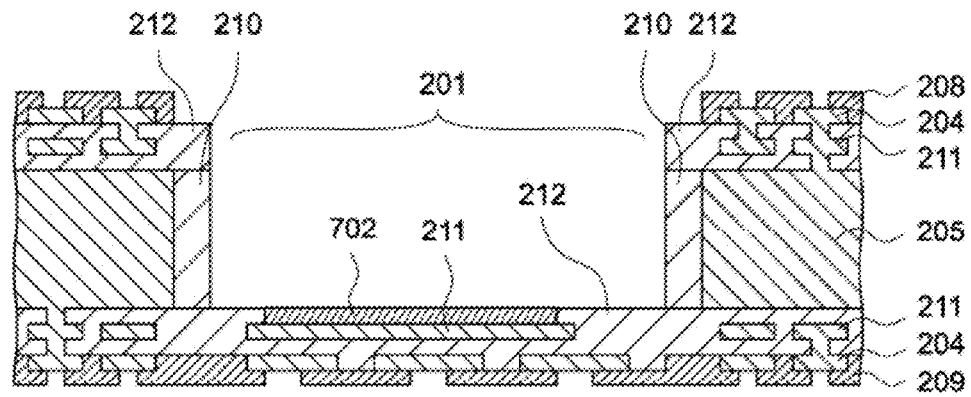
FIGS. 28A and 28B are diagrams showing a manufacturing process of the composite substrate.

Then, as FIG. 28A shows, the conductive layer 702 is formed on the exposed wiring layer 211. The conductive layer 702 can be formed by Ni plating the wiring layer 211. The conductive layer 702 may also be formed by filling the space above the wiring layer 211 with conductive paste or by filling the space above the wiring layer 211 with conductive paste and then Ni plating the formed surface. Furthermore, the conductive layer 702 may be formed first by Cu plating the wiring layer 211 and then Ni plating over that.

Figure 28B:
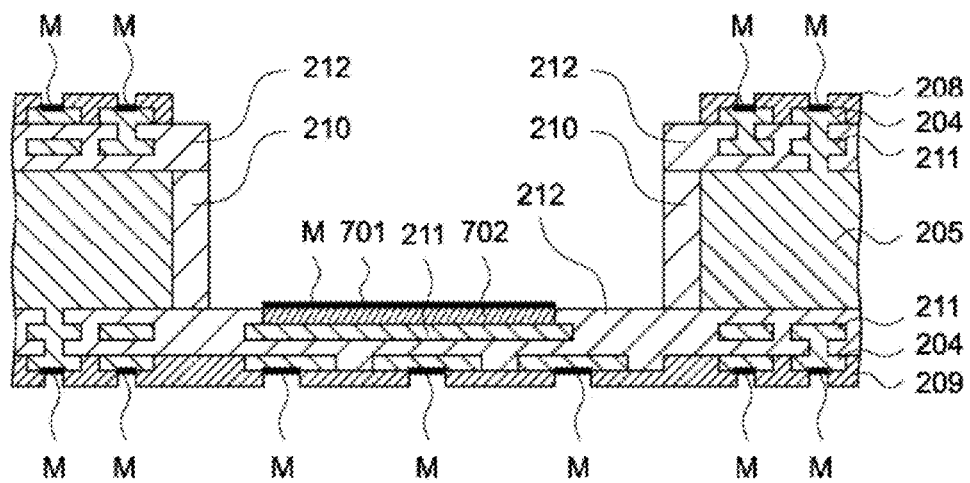

Next, as FIG. 28B shows, the plating layer M is formed on the surface of the wiring layer 211, which forms the connection pads 204 and the connection terminal 701. For the plating layer M, Au or Cu plating can be used when the bonding layer 1200 uses ACP or ACF, and Cu plating can be used when the bonding layer 1200 uses NCP or NCF. When the bonding layer 1200 uses NCP or NCF, the surface of the connection terminal 701 can be coated with solder instead of the plated layer M.

Figure 29A:
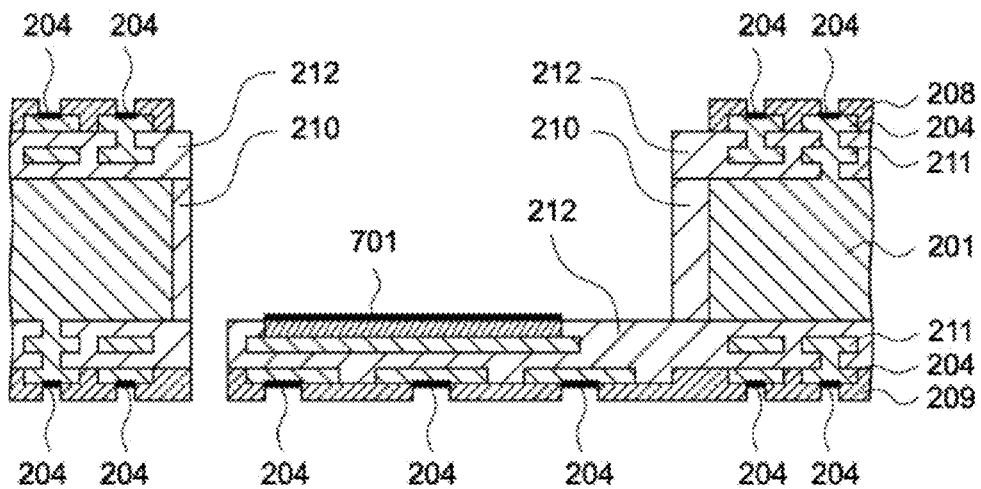
FIGS. 29A and 29B are diagrams showing a manufacturing process of the composite substrate.

Next, as FIG. 29A shows, the insulating layer 212 and the second solder resist layer 209 are cut at a point between the insulating portion 210 and the connection terminal 701. The cut can be made by a dicer. From this, the rigid substrate 700 shown in FIG. 25 is made.

Figure 29B:
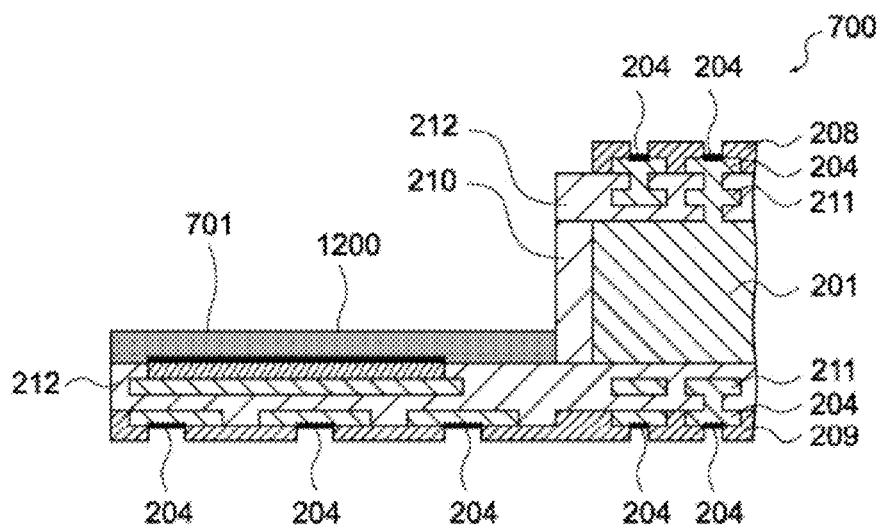

Next, as FIG. 29B shows, the bonding layer 1200 is arranged on the connection terminal 701 and the insulating layer 212, which is located around the connection terminal. The bonding layer 1200 can be arranged by applying ACP or NCP using a dispenser or by placing an ACF or NCF.

Next, the flexible substrate 800 is placed on the bonding layer 1200 to join the rigid substrate 700 and the flexible substrate 800 by heating and to establish an electrical connection between the connection terminal 701 and the connection terminal 301. From this, the composite substrate 1100 shown in FIG. 27 is made.

Modification Example

Figure 30:
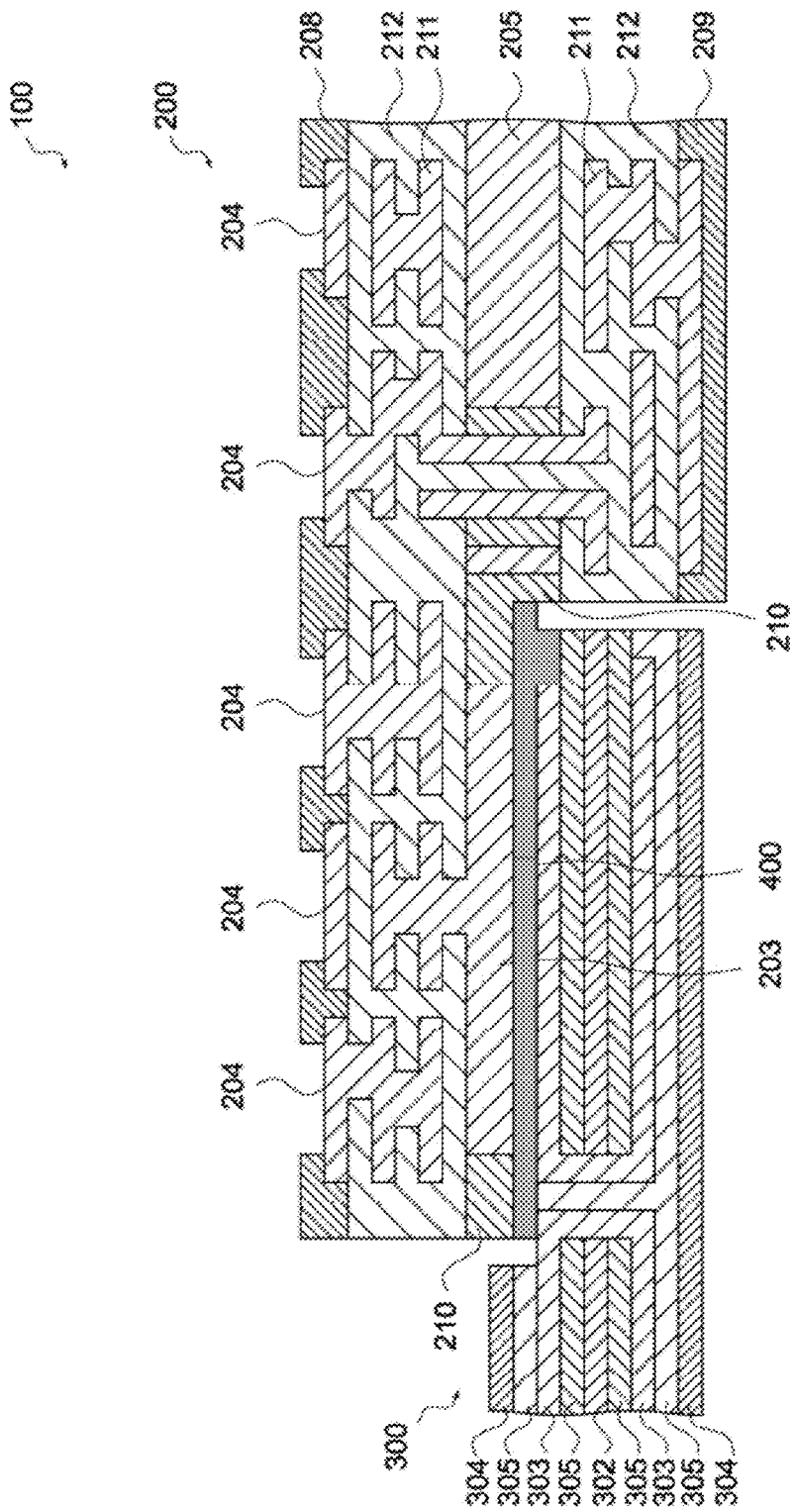
FIG. 30 is a cross-sectional view of the composite substrate according to a modification example of the present invention.

A modification example of the composite substrate according to the present invention is described. FIG. 30 is a cross-sectional view of the composite substrate 100 according to the modification example. Instead of the wiring layer 211, part of the core layer 205 may form the connection terminal 203. In the step where the core layer 205 is removed and the cutout 201 is created in the manufacturing process described above, the composite substrate 100 can be manufactured by digging the core layer 205 using a router, not an etchant, and preserving a predetermined thickness in the core layer 205.

Figure 31:
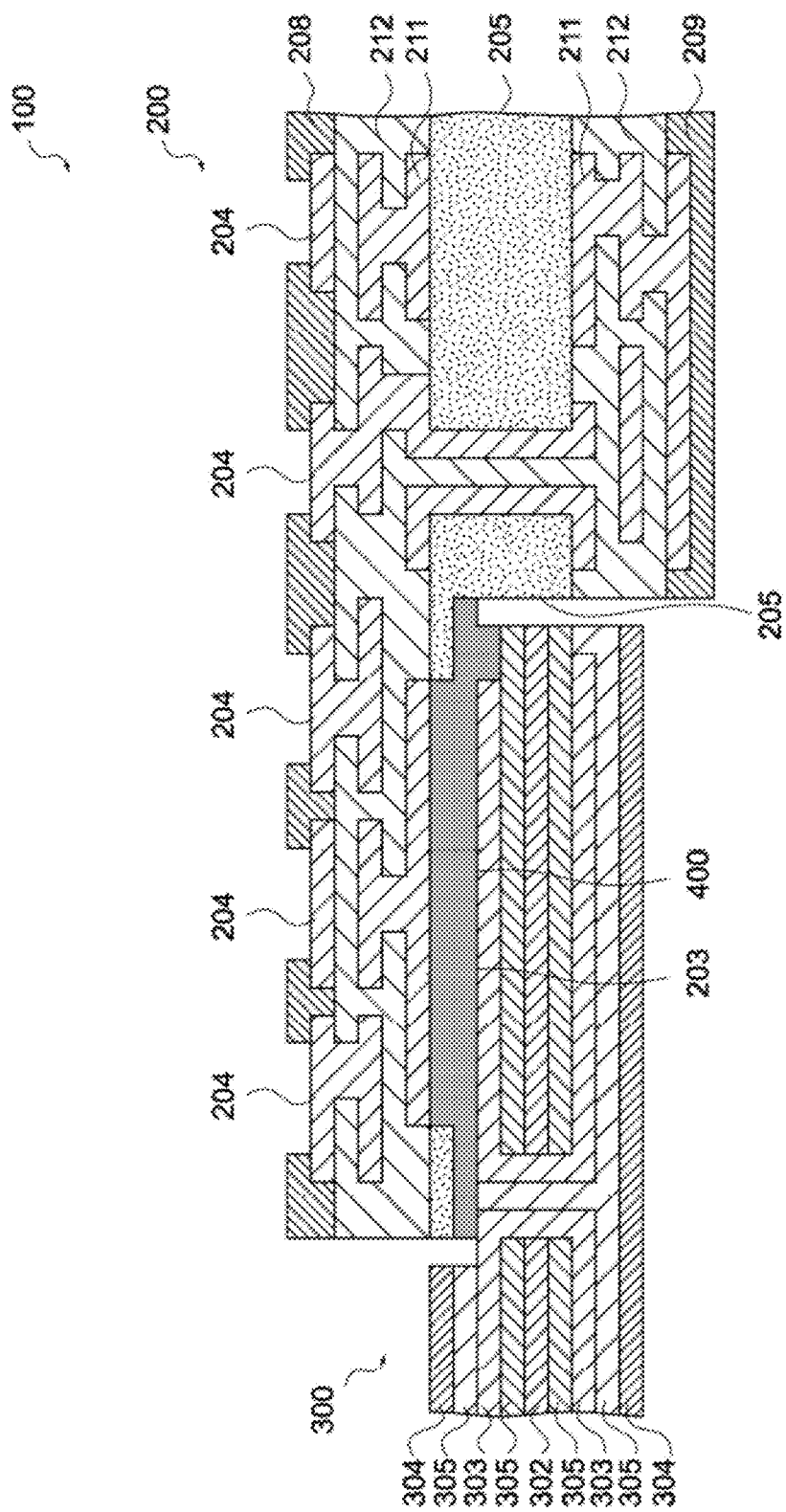
FIG. 31 is a cross-sectional view of the composite substrate according to a modification example of the present invention.

FIG. 31 is a cross-sectional view of the composite substrate 100 according to another modification example. The core layer 205 can be made of synthetic resin instead of metal. Synthetic resin such as glass epoxy resin can be used. In the step where the core layer 205 is removed and the cutout 201 is created in the manufacturing process described above, the composite substrate 100 can be manufactured by digging and removing the core layer 205 using a router, not an etchant.

FIG. 3 shows a plan view of a polygonal rigid substrate. This rigid substrate 200 has the core layer 205 and the first and second internal wiring layers 206 and 207. Hereinafter, the first internal wiring layer is referred to as the "second laminated layer" and second internal wiring layer is referred to as the "first laminated layer." These laminated layers are respectively provided on the first surface and second surface of this core layer. Each of these laminated layers 206 and 207 is constituted by at least one wiring layer made of an insulating layer and conductive pattern. In this example, the laminated layer on the first surface of the core layer on the top in FIG. 3 is the second laminated layer 206, and the laminated layer on the second surface of the core layer on the bottom in FIG. 3 is the first laminated layer 207.

Next, the cutout 201 is formed by the removal of the second laminated layer 206 and the core layer 205 of the rigid substrate 200, and the resulting shape is theoretically a hexahedron, and is a cuboid in this example. In FIG. 3, the area corresponding to the bottom of the cutout 201 is the first surface, and the opposing surface (removed in FIG. 3) is the second surface. In addition, the four side faces in the cutout (one of which is removed), clockwise from the area where the connection terminals 203 are located, are the first side face (removed), second side face, third side face, and fourth side face. As described before, the first side face and the second surface have been removed in FIG. 3, and thus the portions of the cavity where the first side face and the second surface were removed are now exposed to the outside atmosphere.

The long side of the first side face of the cutout is the length of the cutout, and the walls 202 are formed by being less than the length of the corresponding rigid substrate. It should be noted that "providing the cutout 201 in one side" means that the first side face of the cutout 201, i.e., as defined by the gap between the walls, aligns with a side face of the rigid substrate 200.

These walls 202 are located at both sides of the cutout 201 and respectively contact the second side face and the fourth side face of the cutout. It should be noted that, during the processing of the cutout 201, these walls 202 are portions that are left over after the second laminated layer 206 and the core layer 205 are removed. The walls 202 have a thickness that is the sum of the thickness of the second laminated layer 206 and the core layer 205, and are rectangular in a plan view. The first laminated layer 207 is provided so as to cover these two walls 202 and the cutout 201.

The first laminated layer 207 has connection pads 204 on the top thereof, and connection terminals 203 on the bottom. As described above, the "laminated layers" are each constituted by at least one wiring layer made of an insulating layer and conductive pattern. Due to this, as shown in FIG. 17 and the like, wiring lines, through-holes, etc. are provided between the connection terminals 203 and the connection pads 204.

As can be understood from FIG. 1, the first laminated layer 207 is secured to the flexible substrate 300 despite the area of the first laminated layer being thinner than the rigid substrate 200. As shown in FIG. 17, the top of the rigid substrate 200 corresponding to the cutout 201 includes the surface components 900. Due to the difference in the thermal expansion coefficient between the terminals and the surface component 900 and due to the cutout 201 in the substrate, there is a risk of deflection of the first laminated layer 207. The walls 202 respectively provided on each side of the cutout 201, however, make it possible to prevent such deflection. Furthermore, the surface components 900 can be provided on the connection pads 204, which enhances mounting efficiency and allows for a stable connection.

There is also the following merit when attaching the surface components 900: In FIG. 4, consider a scenario in which the bottom surface of the substrate is placed on a work table and the surface components 900 are attached. At such time, as shown in FIG. 1, the cutout 201 is deeper than the flexible substrate 300 is tall, and thus the walls 202 respectively located on both sides can contact the work table. Thus, the rigid substrate 200 itself is stabilized on the work table, which allows for stable mounting of the surface components 900.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A composite substrate, comprising:
   a rigid substrate including a core layer, a first laminated layer on a first surface of the core layer, and a second laminated layer on a second surface of the core layer that is opposite to the first surface, said first laminated layer having at least one layer each of an insulating layer and a wiring layer laminated together on the first surface, said second laminated layer having at least one layer each of an insulating layer and a wiring layer laminated together on the second surface, said rigid substrate having a cutout in the core layer and the second laminated layer on one side face of the rigid substrate, exposing partially a surface of the first laminated layer as a bottom surface of said cutout, said partially exposed surface of the first laminated layer having connection terminals formed thereon; and
   a flexible substrate inserted into said cutout in the rigid substrate on said one side face and laterally and externally protruding from said one side face of the rigid substrate, the flexible substrate being electrically connected to the connection terminals,
   wherein said rigid substrate has opposing walls each constituted of the second laminated layer and the core layer erected on the first laminated layer to define inner side faces, respectively, of the cutout so as to accommodate the flexible substrate in a direction perpendicular to a direction in which said side face of the rigid substrate extends, and
   wherein said core layer of said rigid substrate is made of metal, and end faces of said core layer that are exposed to said cutout is covered by an insulating member so as not to expose the metal of the core layer to said cutout.

2. The composite substrate according to claim 1, wherein the cutout is formed by the core layer and the second laminated layer being removed.

3. The composite substrate according to claim 2, wherein a thickness of the flexible substrate is less than the rigid substrate and less than a depth of the cutout.

4. The composite substrate according to claim 1, further comprising:
   connection pads on an outer surface of the first laminated layer that is opposite to said partially exposed surface of the first laminated layer at positions corresponding to the cutout; and
   electric components mounted on said connection pads on said outer surface of the first laminated layer.

* * * * *